United States Patent
Yamasaki

(10) Patent No.: US 10,667,450 B2
(45) Date of Patent: May 26, 2020

(54) CARRIER TAPE FEEDING DEVICE, CHIP MOUNTING SYSTEM, AND CHIP MOUNTING METHOD

(71) Applicant: HANWHA PRECISION MACHINERY CO., LTD., Changwon-do (KR)

(72) Inventor: Kimiyuki Yamasaki, Changwon (KR)

(73) Assignee: Hanwha Precision Machinery Co., Ltd., Seongnam-si, Gyeonggi-do (KR)

( * ) Notice: Subject to any disclaimer, the term of this patent is extended or adjusted under 35 U.S.C. 154(b) by 1094 days.

(21) Appl. No.: 14/419,781

(22) PCT Filed: Apr. 23, 2013

(86) PCT No.: PCT/KR2013/003424
§ 371 (c)(1),
(2) Date: Feb. 5, 2015

(87) PCT Pub. No.: WO2014/025120
PCT Pub. Date: Feb. 13, 2014

(65) Prior Publication Data
US 2015/0195964 A1    Jul. 9, 2015

(30) Foreign Application Priority Data

Aug. 6, 2012  (KR) .................. 10-2012-0085997
Sep. 12, 2012 (KR) .................. 10-2012-0101145
(Continued)

(51) Int. Cl.
*H05K 13/04*    (2006.01)
*H05K 13/08*    (2006.01)

(52) U.S. Cl.
CPC ..... *H05K 13/0417* (2013.01); *H05K 13/0419* (2018.08); *H05K 13/086* (2018.08); *Y10T 29/53174* (2015.01); *Y10T 29/53178* (2015.01)

(58) Field of Classification Search
CPC ......... Y10T 29/53174; Y10T 29/53178; Y10T 29/53261; H05K 13/02; H05K 13/04; H05K 13/0417; H05K 13/08
(Continued)

(56) References Cited

U.S. PATENT DOCUMENTS

2003/0219330 A1   11/2003  Lyndaker et al.
2004/0078962 A1    4/2004  Ohashi et al.
(Continued)

FOREIGN PATENT DOCUMENTS

JP    2004-119637 A    4/2004
JP    2010-135521 A    6/2010
(Continued)

OTHER PUBLICATIONS

International Search Report (PCT/ISA/210) dated Jul. 25, 2013, issued in International Application No. PCT/KR2013/003424.
(Continued)

*Primary Examiner* — Peter Dungba Vo
*Assistant Examiner* — Joshua D Anderson
(74) *Attorney, Agent, or Firm* — McLean IP Global; Jason Y. Pahng

(57) ABSTRACT

Provided are a carrier tape feeding device, a chip mounting system, and a chip mounting method. The carrier tape feeding device includes: a transfer unit for transferring a first carrier tape and a second carrier tape sequentially to a chip mounting apparatus; a rotation unit selectively engaged to a part of the first carrier tape with which a part of the second carrier tape contacts, and for transferring the second carrier tape to the transfer unit; a detecting sensor unit for detecting sequential existence of the first carrier tape or the second carrier tape supplied to the transfer unit, and existence of the second carrier tape supplied to the rotation unit; and a controller for determining existence of the first carrier tape
(Continued)

based on a signal detected by the detecting sensor unit, and controlling at least one of the transfer unit and the rotation unit to be driven based on the existence of the first carrier tape.

31 Claims, 14 Drawing Sheets

(30) Foreign Application Priority Data

Sep. 21, 2012 (KR) ........................ 10-2012-0105250
Oct. 5, 2012 (KR) ........................ 10-2012-0110686

(58) Field of Classification Search
USPC .......................................... 29/739, 740, 759
See application file for complete search history.

(56) References Cited

U.S. PATENT DOCUMENTS

| | | | | |
|---|---|---|---|---|
| 2004/0130863 A1* | 7/2004 | Shimizu | ............ | H05K 13/0417 361/679.01 |
| 2010/0180435 A1* | 7/2010 | Shin | ............ | B65H 37/002 29/740 |
| 2010/0239401 A1 | 9/2010 | Kim | | |
| 2011/0072654 A1* | 3/2011 | Oyama | ............ | H05K 13/0417 29/832 |
| 2011/0243695 A1* | 10/2011 | Hwang | ............ | H05K 13/0215 414/412 |
| 2013/0161371 A1* | 6/2013 | Nagao | ............ | H05K 13/0417 226/86 |
| 2015/0296669 A1* | 10/2015 | Kitani | ............ | H05K 13/021 221/71 |

FOREIGN PATENT DOCUMENTS

| | | |
|---|---|---|
| JP | 2010-212681 A | 9/2010 |
| JP | 2011-077096 A | 4/2011 |
| JP | 2011-159677 A | 8/2011 |
| JP | 2011-211169 A | 10/2011 |
| JP | 2012-009579 A | 1/2012 |
| JP | 2012-084771 A | 4/2012 |
| JP | 2012-164866 A | 8/2012 |
| KR | 2010-0084748 A | 7/2010 |

OTHER PUBLICATIONS

Written Opinion (PCT/ISA/237) dated Jul. 25, 2013, issued in International Application No. PCT/KR2013/003424.
KR Office Action dated Dec. 3, 2018 for KR Application No. 10-2012-0101145.
KR Office Action dated Dec. 10, 2018 for KR Application No. 10-2012-0105250.
KR Office Action dated Sep. 26, 2019 for KR Application No. 10-2012-0110686.

* cited by examiner

[Fig. 1]
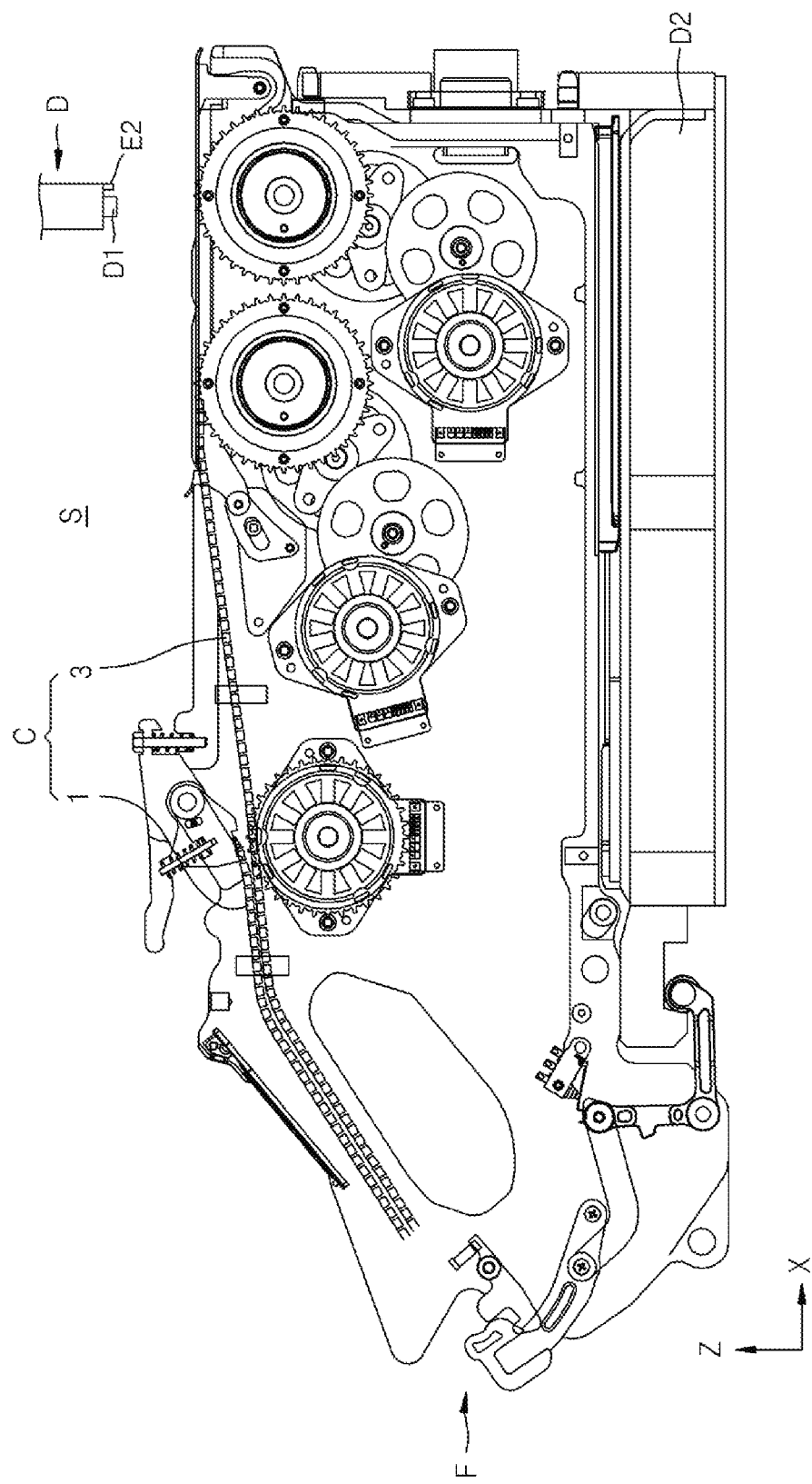

[Fig. 2]
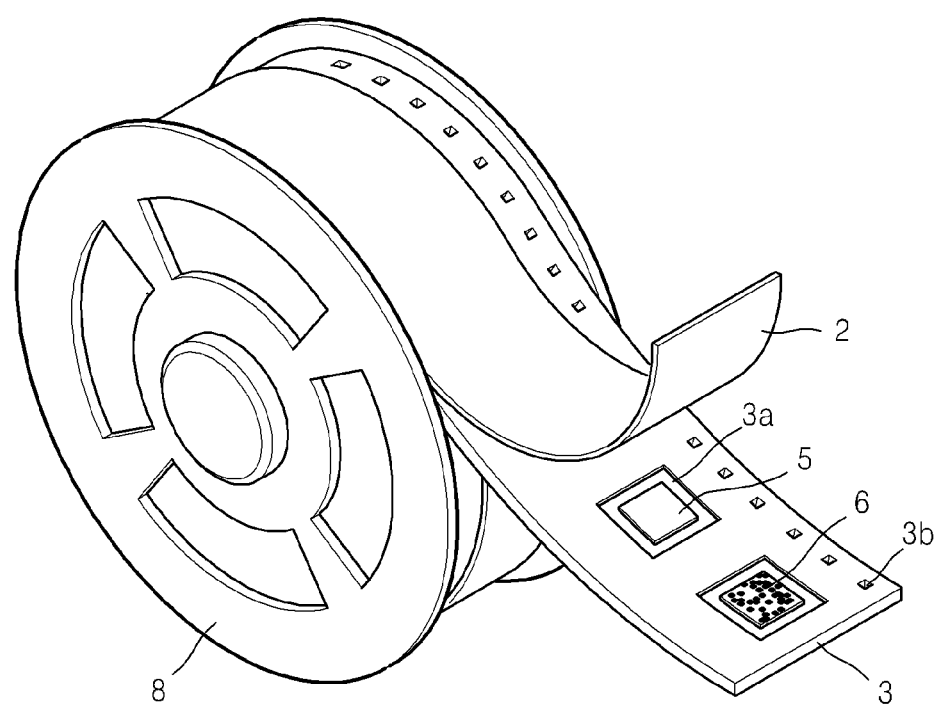

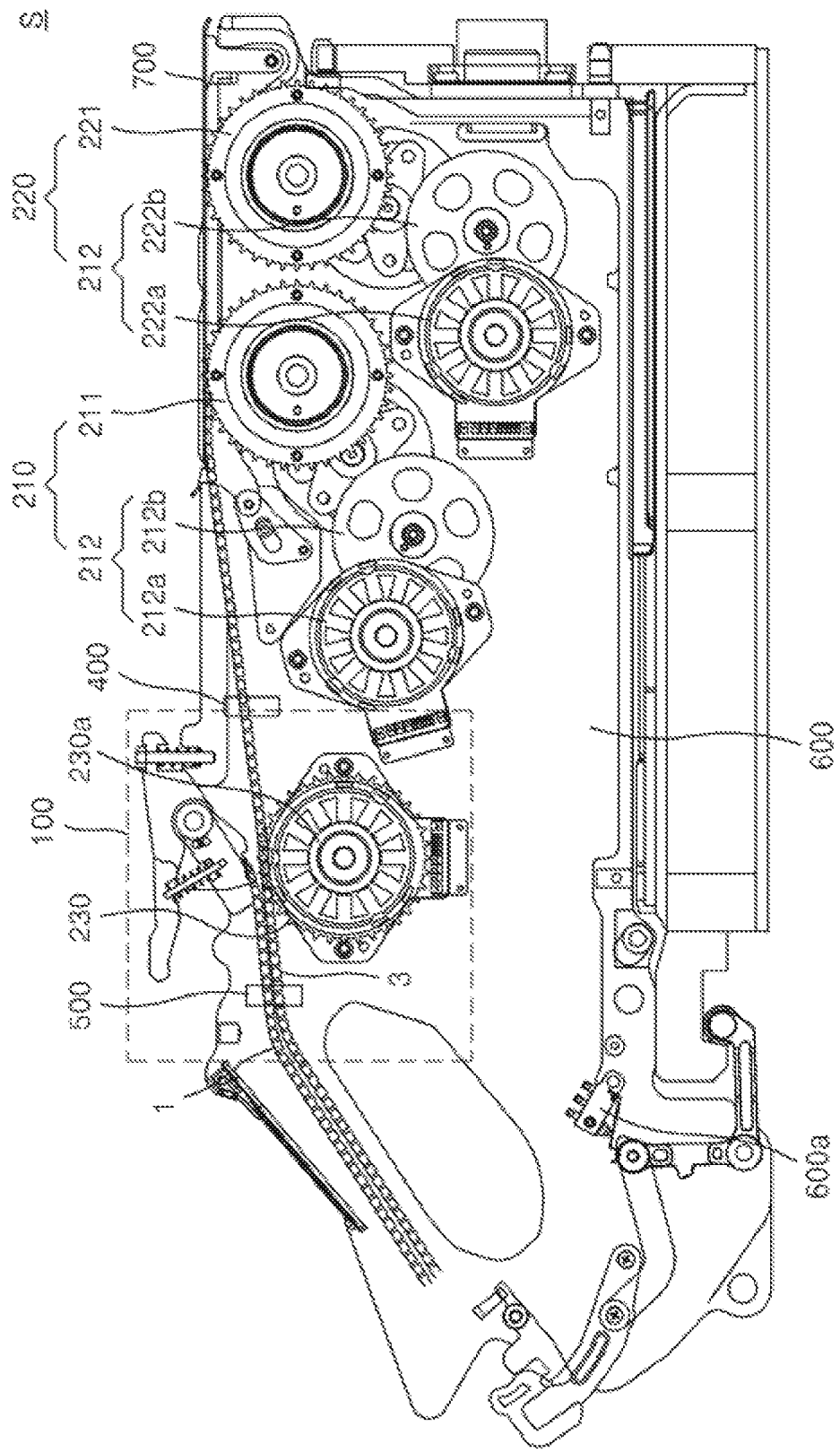
[Fig. 3]

[Fig. 4]
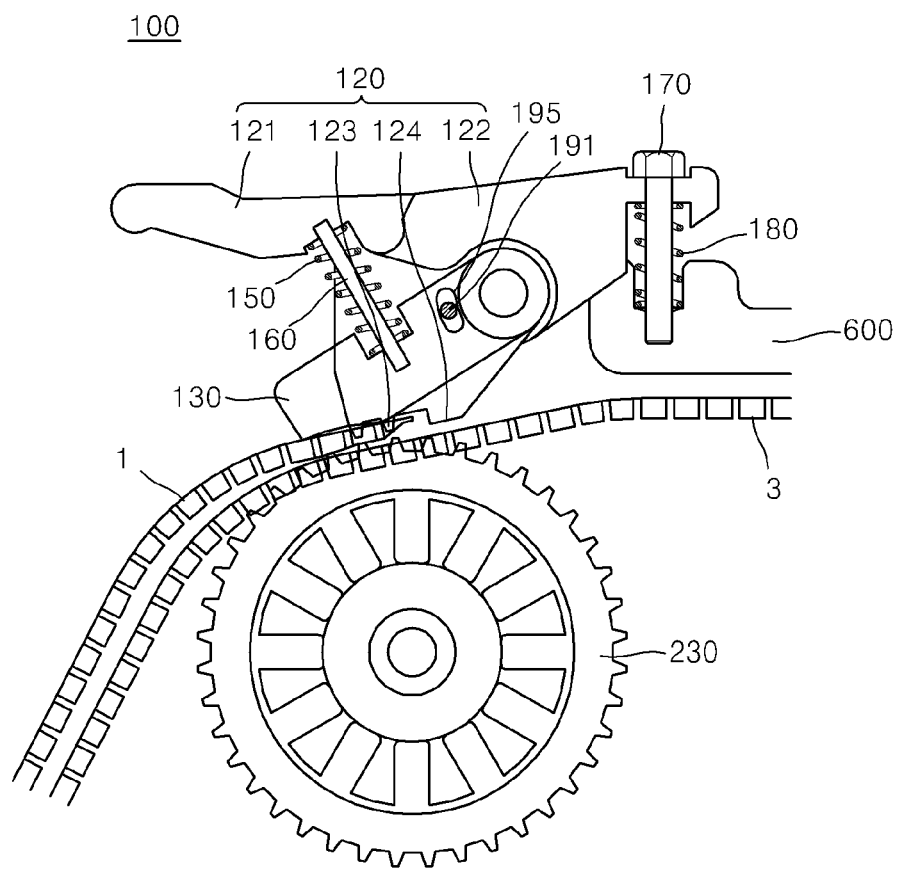

[Fig. 5]
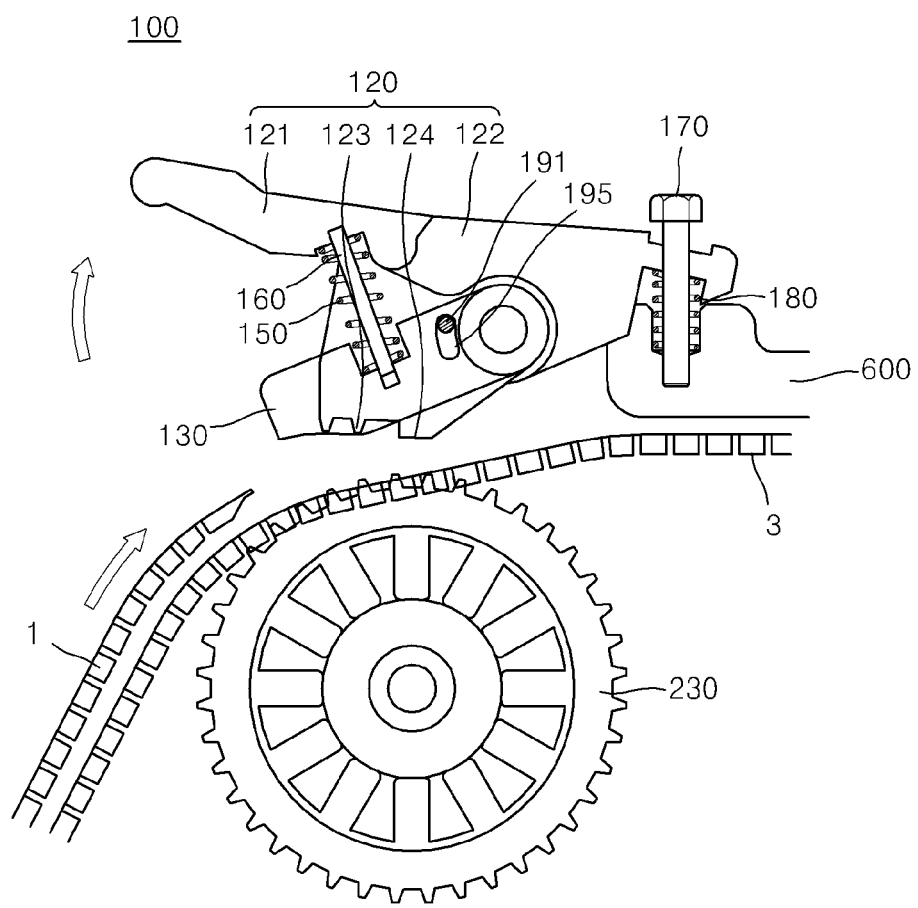

[Fig. 6]
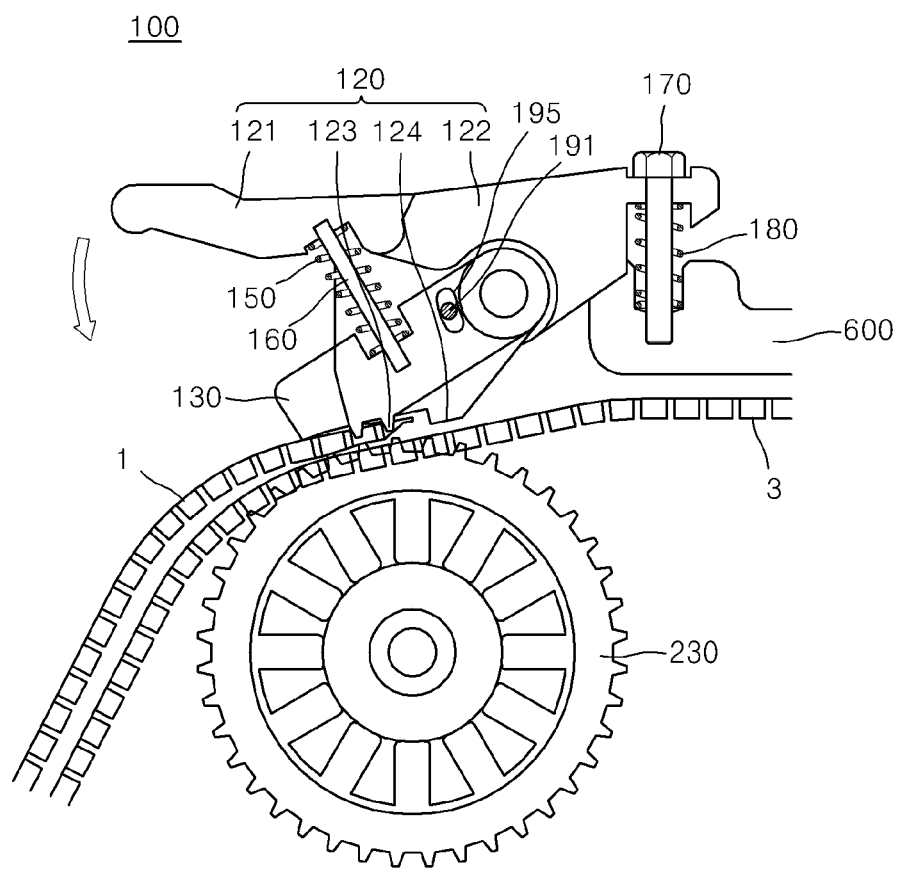

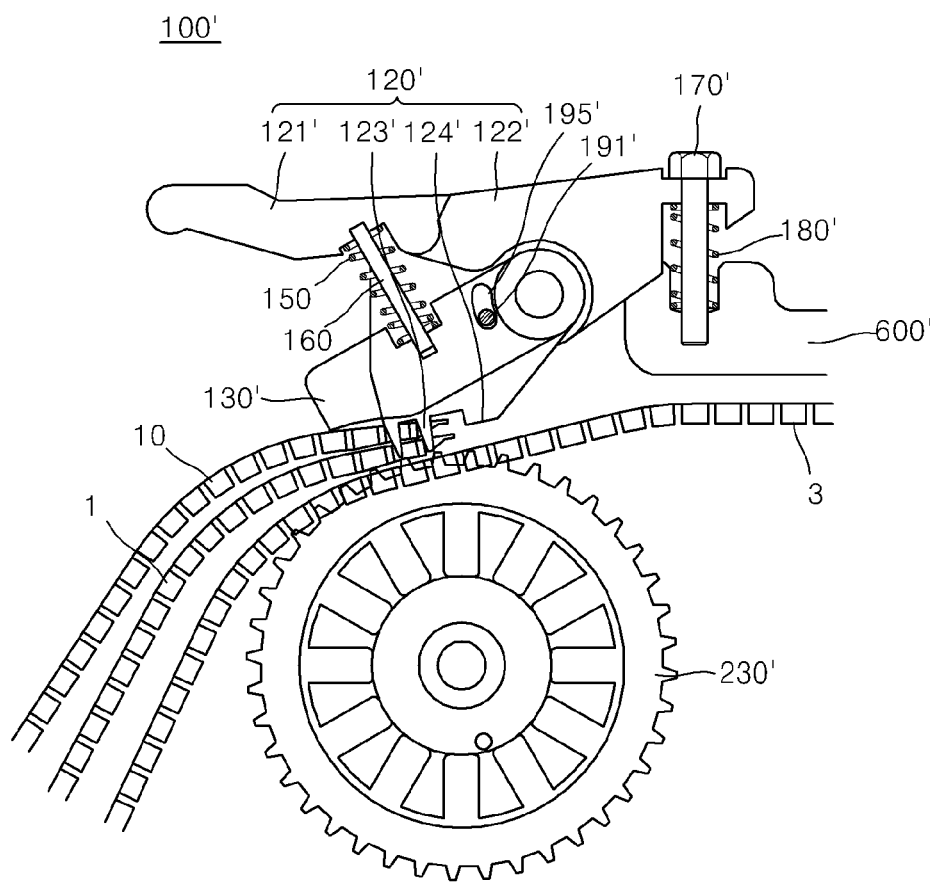
[Fig. 7]

[Fig. 8]
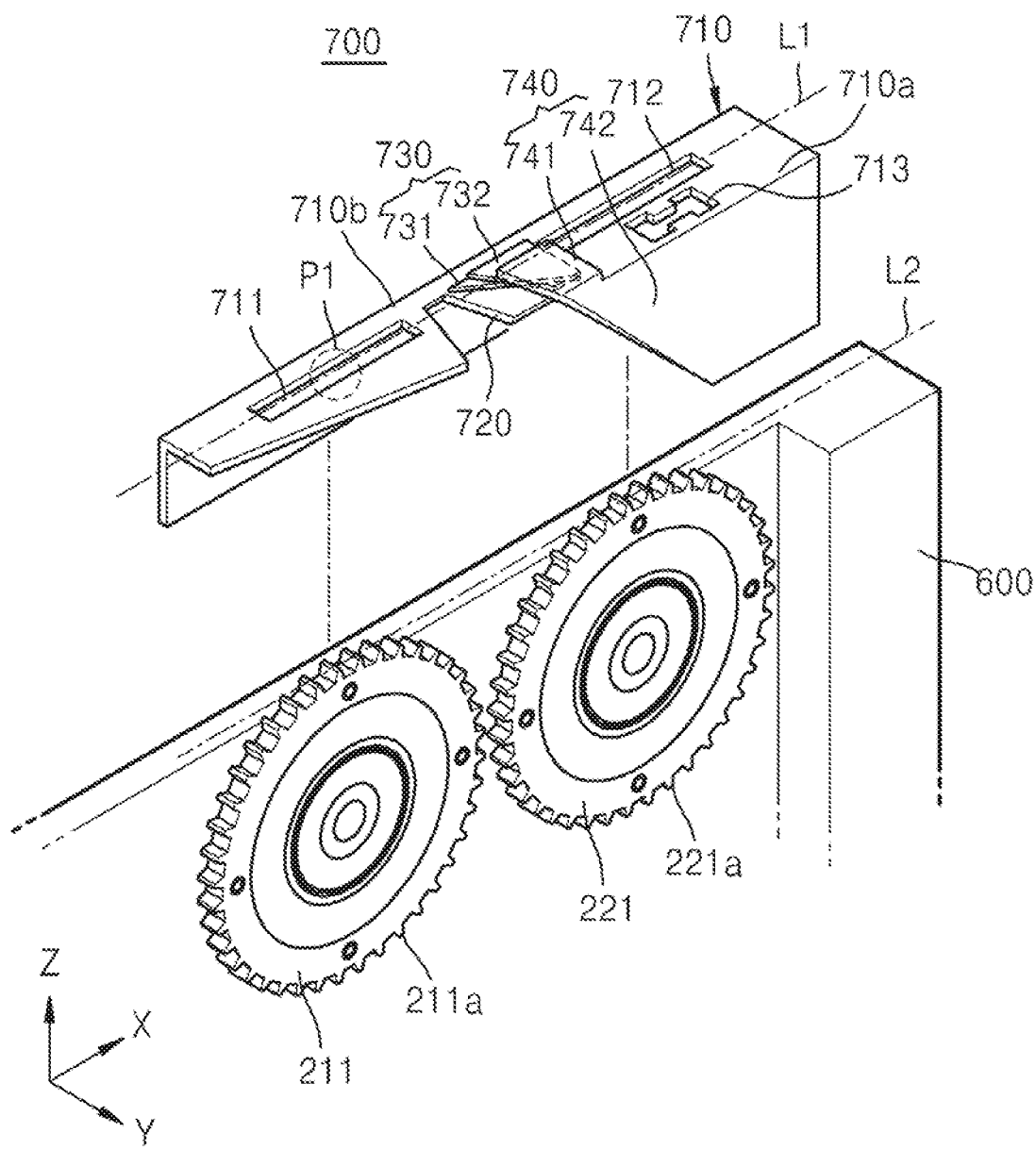

[Fig. 9]
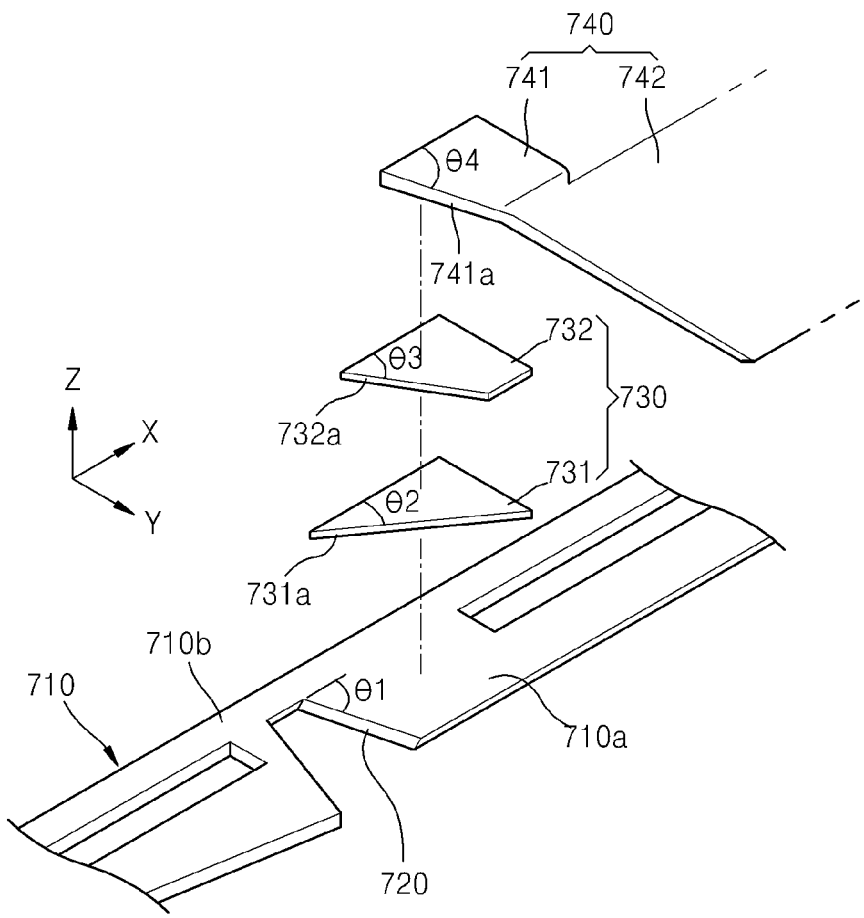
[Fig. 10]
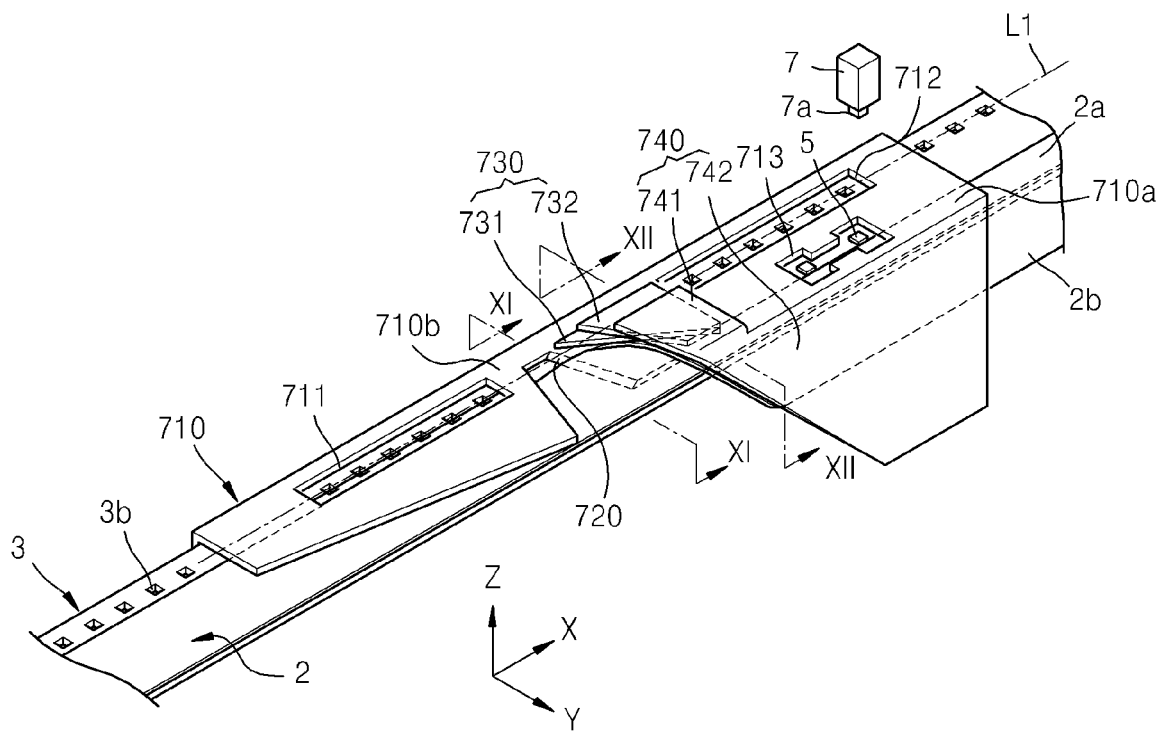

[Fig. 11]
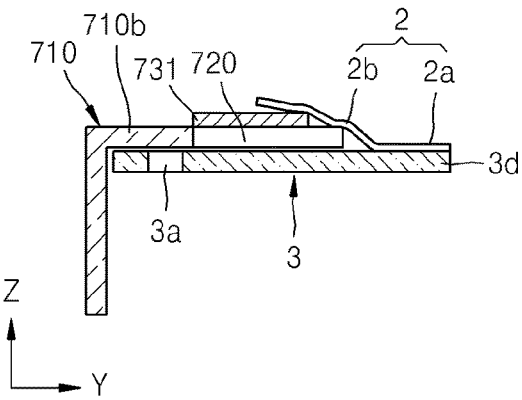
[Fig. 12]
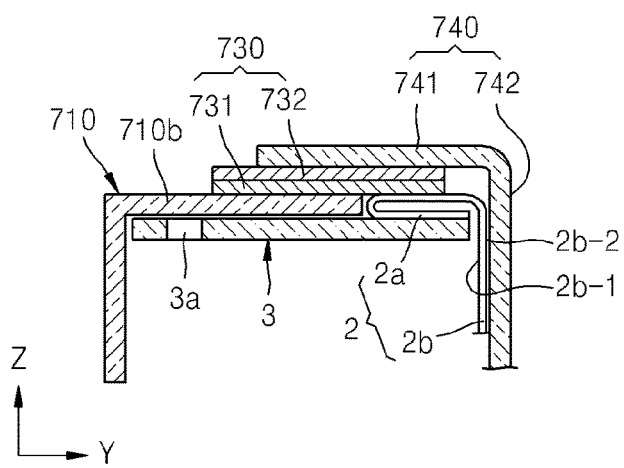
[Fig. 13]
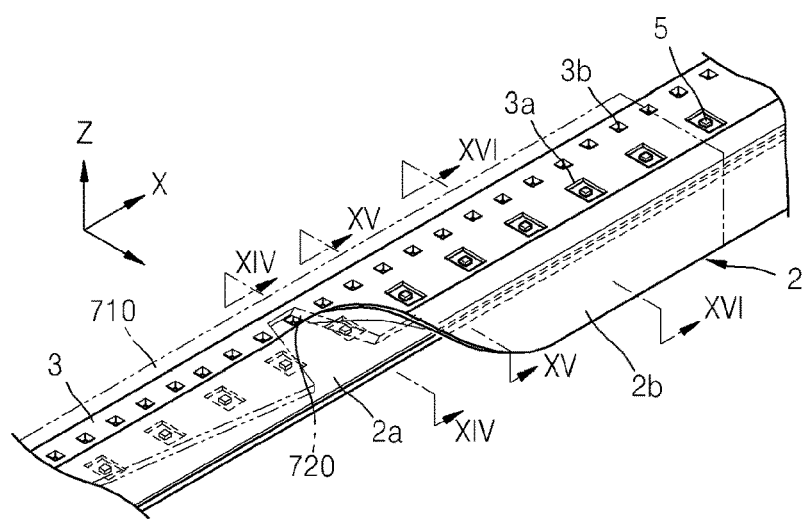
[Fig. 14]
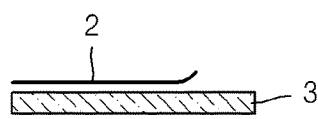

[Fig. 15]
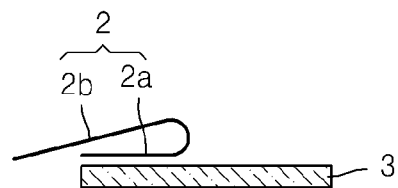
[Fig. 16]
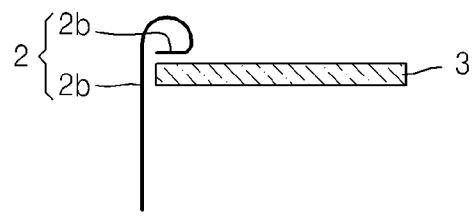
[Fig. 17a]
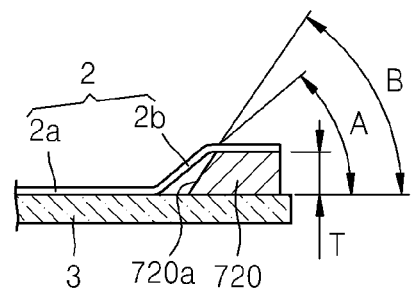
[Fig. 17b]
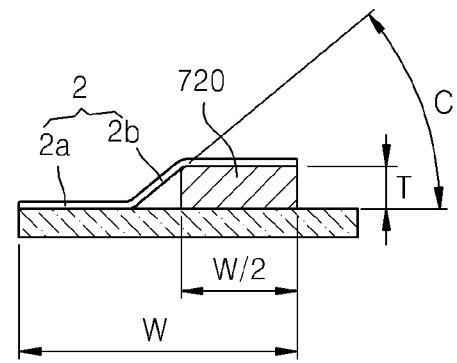

[Fig. 18]
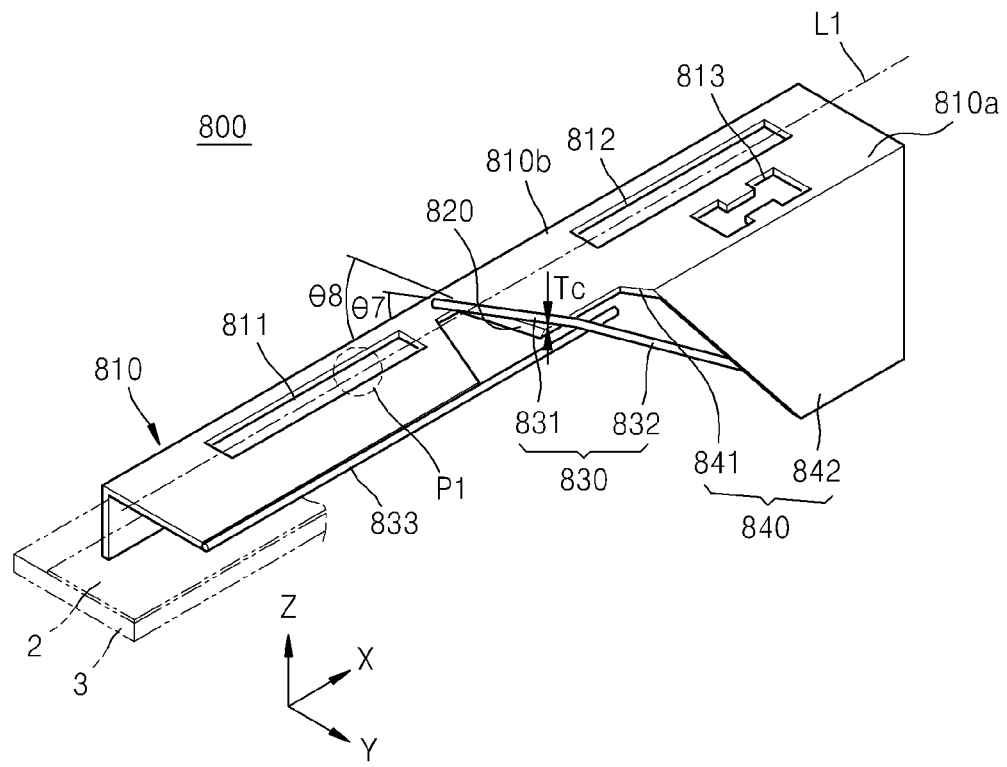
[Fig. 19]
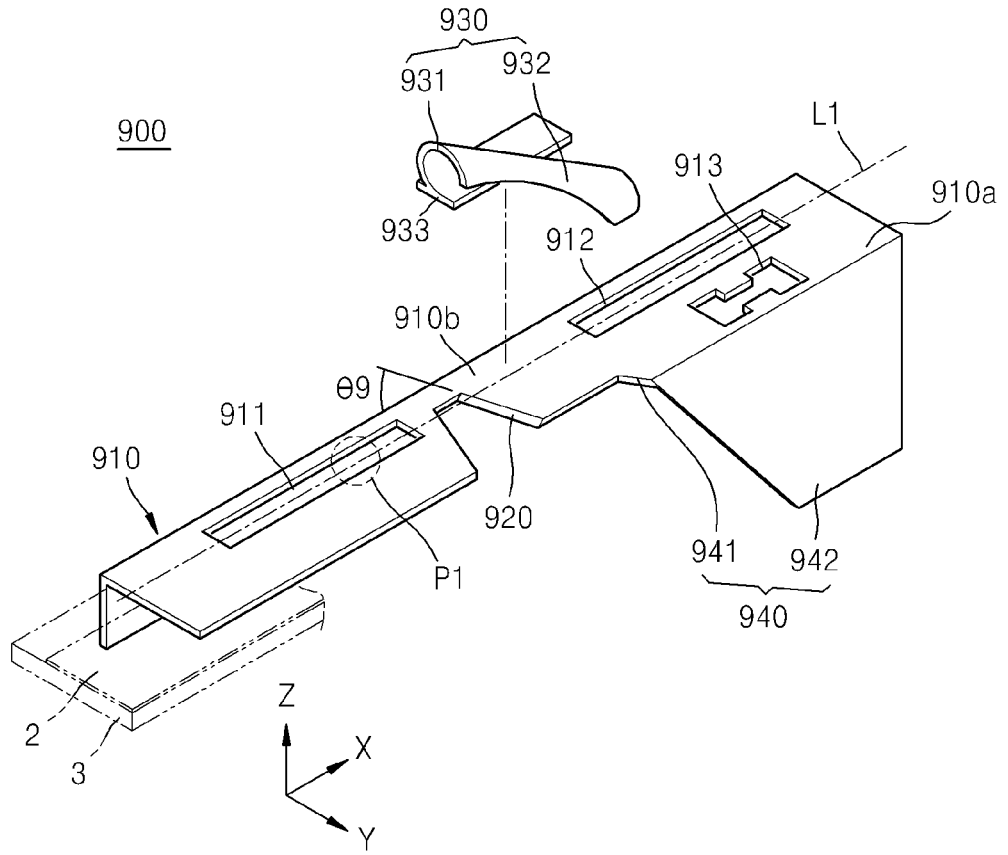

[Fig. 20]
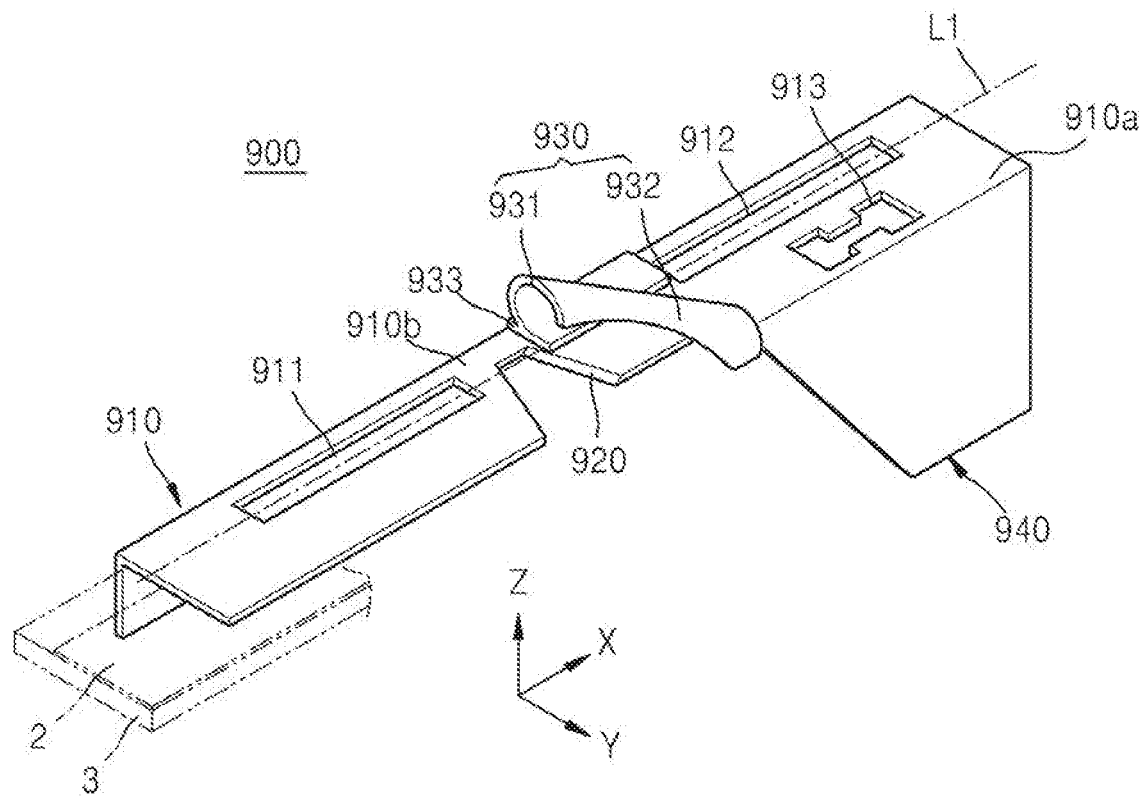
[Fig. 21]
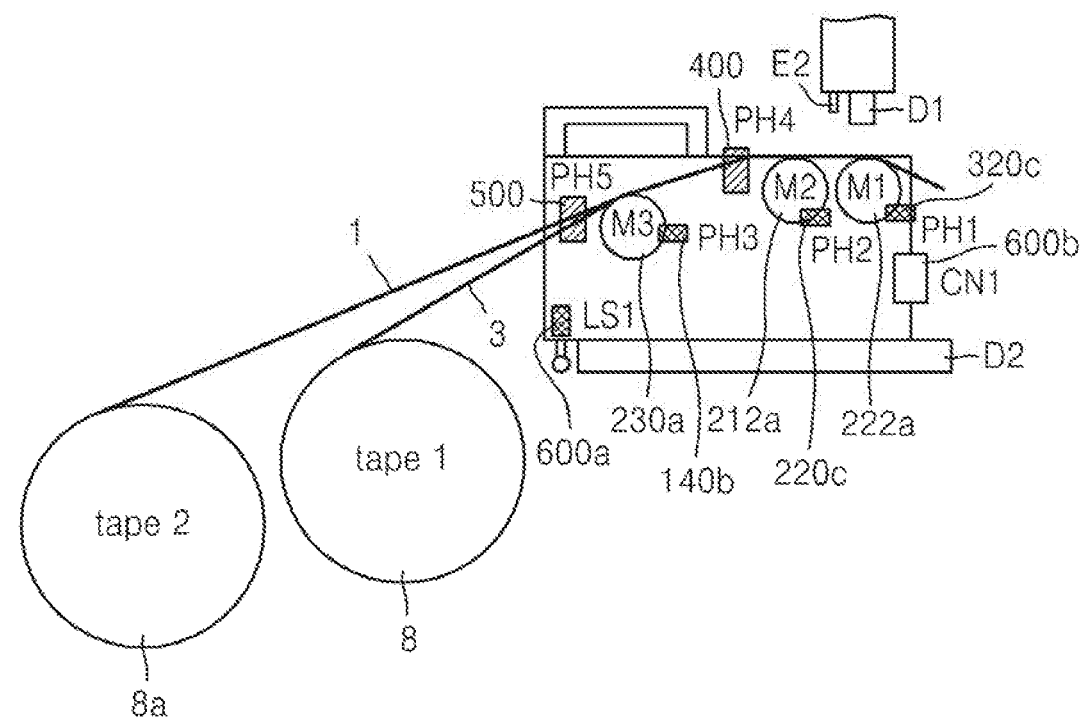

[Fig. 22]
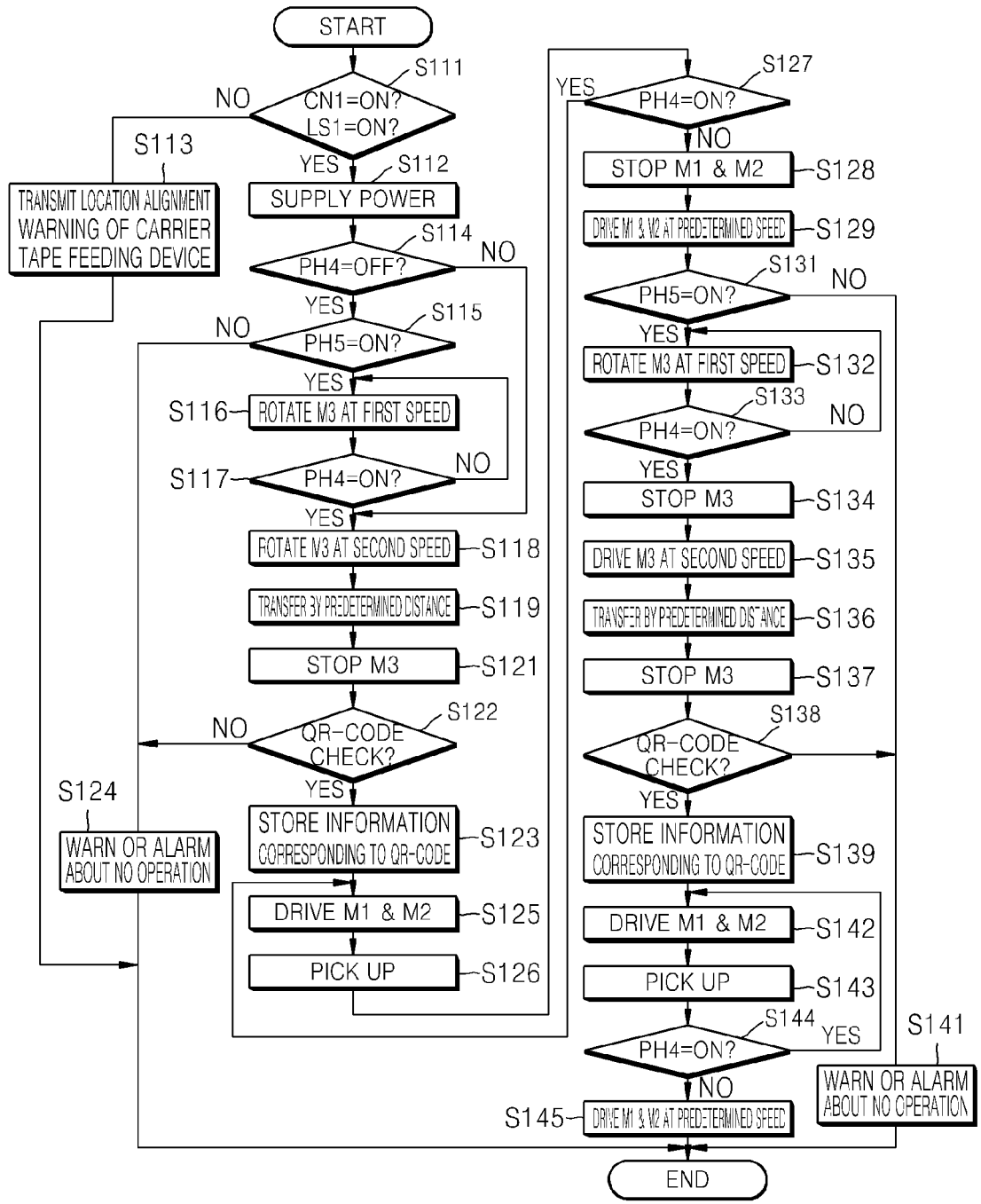

CARRIER TAPE FEEDING DEVICE, CHIP MOUNTING SYSTEM, AND CHIP MOUNTING METHOD

TECHNICAL FIELD

The present invention relates to a feeding device, a system, and a method, and more particularly, to a carrier tape feeding device, a chip mounting system, and a chip mounting method.

BACKGROUND ART

Chip mounting systems are systems for surface-mounting an electronic component onto a printed circuit board (PCB), and perform operations of receiving and moving various electronic components, such as integrated circuits (ICs), diodes, capacitors, and resistors, from a carrier tape feeding device to surface-mounting locations of a PCB, and then surface-mounting the various electronic components on the PCB.

The chip mounting systems generally include a tape feeder for providing a carrier tape including a component, a conveyer for transferring a PCB, a head assembly including nozzles to pick up the component from the tape feeder and surface-mount the component onto the PCB, and a driving apparatus for moving the head assembly in a horizontal or vertical direction.

Generally, the carrier tape feeding device continuously provides a carrier tape including an electronic component while separating a cover tape attached to a surface of the carrier tape, thereby exposing the electronic component for the head assembly to pick it up. The carrier tape from which the cover tape is separated is discharged in front of the carrier tape feeding device, and the cover tape separated from the carrier tape is discharged at the rear of the carrier tape feeding device.

Such a general chip mounting system is disclosed in US2003/0230617 (published on 18 Dec. 2003) in detail.

Meanwhile, such a carrier tape feeding device may include a carrier tape loading unit to provided a plurality of carrier tapes. In the carrier tape loading unit, continuity and immediacy of operations may be obtained without having to replace a carrier tape by providing a plurality of carrier tapes. Specifically, in the carrier tape loading unit, the carrier tapes may be sequentially supplied by pressurizing the carrier tapes.

DISCLOSURE OF INVENTION

Technical Problem

However, when carrier tapes are supplied from such a carrier tape loading unit, a carrier tape may also be transferred while transferring a pre-supplied carrier tape or the carrier tapes may abnormally move, and thus the carrier tapes may be stopped from being supplied. Also, in the carrier tape loading unit, a jam phenomenon may occur due to movements of the carrier tapes during transference.

A general carrier tape feeding device including such a carrier tape loading unit is disclosed in KR 10-1020561 (title of the invention: Carrier Tape Feeding Device, Applicant: STS Co., Ltd) in detail.

Also, by using the general carrier tape feeding device described above, a plurality of carrier tapes may be simply provided to be continuously supplied. However, in this case, the carrier tapes that are continuously provided cannot be accurately aligned, and thus a carrier tape may be wasted or may cause a chip mounting apparatus to malfunction.

Solution to Problem

Embodiments of the present invention provide a carrier tape feeding device, a chip mounting system, and a chip mounting method, which are capable of automatically supplying a plurality of carrier tapes to a chip mounting apparatus.

According to an embodiment of the present invention, there is provided a carrier tape feeding device including: a transfer unit for transferring a first carrier tape and a second carrier tape sequentially to a chip mounting apparatus; a rotation unit selectively engaged to a part of the first carrier tape with which a part of the second carrier tape contacts, and for transferring the second carrier tape to the transfer unit; a detecting sensor unit for detecting sequential existence of the first carrier tape or the second carrier tape supplied to the transfer unit, and existence of the second carrier tape supplied to the rotation unit; and a controller for determining existence of the first carrier tape based on a signal detected by the detecting sensor unit, and controlling at least one of the transfer unit and the rotation unit to be driven based on the existence of the first carrier tape.

Advantageous Effects of Invention

According to embodiments of the present invention, carrier tapes may be sequentially supplied such that operations are quickly and smoothly performed without having to replace a carrier tape. In addition, since a plurality of carrier tapes can be automatically supplied through a simple structure instead of a skilled worker manually replacing them, flaws and malfunctions in products caused by a non-skilled worker can be reduced.

According to embodiments of the present invention, collection apparatuses of carrier tapes and cover tapes may not be differently designed according to changes of widths of the carrier tapes and cover tapes, and even when the widths of the carrier tapes and cover tapes are wide, a width increase of a carrier tape feeding device may be reduced.

Also, according to embodiments of the present invention, a loss of carrier tapes may be prevented and continuity of operations may be obtained by accurately and sequentially supplying carrier tapes by using a pick-up nozzle after replacing carrier tapes in a carrier tape feeding device.

BRIEF DESCRIPTION OF DRAWINGS

FIG. 1 is a cross-sectional view of a chip mounting system according to an embodiment of the present invention;

FIG. 2 is a perspective view of a first carrier tape of FIG. 1;

FIG. 3 is a cross-sectional view of a carrier tape feeding device according to an embodiment of the present invention;

FIG. 4 is a conceptual view of a carrier tape loading unit of FIG. 3, according to an embodiment of the present invention;

FIG. 5 is a conceptual view for describing a first operation of the carrier tape loading unit of FIG. 4;

FIG. 6 is a conceptual view for describing a second operation of the carrier tape loading unit of FIG. 4;

FIG. 7 is a conceptual view of a carrier tape loading unit of FIG. 3, according to another embodiment of the present invention;

FIG. 8 is a perspective view schematically illustrating a combination relationship of some components of a cover tape removing unit of FIG. 1;

FIG. 9 is an exploded perspective view of some components of the cover tape removing unit of FIG. 8;

FIG. 10 is a perspective view schematically illustrating an operation state of the cover tape removing unit of FIG. 8;

FIG. 11 is a cross-sectional view taken along line XI-XI of the cover tape removing unit of FIG. 10;

FIG. 12 is a cross-sectional view taken along line XII-XII of the cover tape removing unit FIG. 10;

FIG. 13 is a perspective view schematically illustrating an operation relationship of a first carrier tape and a first cover tape in the cover tape removing unit of FIG. 10;

FIG. 14 is a cross-sectional view taken along line XIV-XIV of the first carrier tape of FIG. 13;

FIG. 15 is a cross-sectional view taken along line XV-XV of the first carrier tape of FIG. 13;

FIG. 16 is a cross-sectional view taken along line XVI-XVI of the first carrier tape of FIG. 13;

FIG. 17A is a cross-sectional view schematically illustrating an operation state wherein the first cover tape is separated from the first carrier tape by the cover tape removing unit of FIG. 10;

FIG. 17B is a cross-sectional view at a different angle from FIG. 17A;

FIG. 18 is a perspective view schematically illustrating a cover tape removing unit according to another embodiment of the present invention;

FIG. 19 is a perspective view schematically illustrating some components of a cover tape removing unit, according to another embodiment of the present invention;

FIG. 20 is a perspective view of the cover tape removing unit of FIG. 19;

FIG. 21 is a conceptual view of a chip mounting system of FIG. 1; and

FIG. 22 is a flowchart illustrating a method of controlling the chip mounting system of FIG. 21.

BEST MODE FOR CARRYING OUT THE INVENTION

According to an embodiment of the present invention, there is provided a carrier tape feeding device including: a transfer unit for transferring a first carrier tape and a second carrier tape sequentially to a chip mounting apparatus; a rotation unit selectively engaged to a part of the first carrier tape with which a part of the second carrier tape contacts, and for transferring the second carrier tape to the transfer unit; a detecting sensor unit for detecting sequential existence of the first carrier tape or the second carrier tape supplied to the transfer unit, and existence of the second carrier tape supplied to the rotation unit; and a controller for determining existence of the first carrier tape based on a signal detected by the detecting sensor unit, and controlling at least one of the transfer unit and the rotation unit to be driven based on the existence of the first carrier tape.

The transfer unit may include: a first transfer unit for transferring the first carrier tape or the second carrier tape; and a second transfer unit spaced apart from the first transfer unit in a predetermined interval to transfer the first carrier tape or the second carrier tape.

The detecting sensor unit may include a first detecting sensor unit disposed between the transfer unit and the rotation unit to detect existence of the first carrier tape or the second carrier tape sequentially supplied by the rotation unit.

The detecting sensor unit may include a second detecting sensor unit spaced apart from the rotation unit in a predetermined interval, and for detecting existence of at least one of the first carrier tape and the second carrier tape supplied to the rotation unit.

The transfer unit may include a first sprocket for determining a location of the first carrier tape or the second carrier tape as a part of the first sprocket is inserted into a first transfer hole of the first carrier tape or a second transfer hole of the second carrier tape.

The transfer unit may include a second sprocket for transferring the first carrier tape or the second carrier tape as a part of the second sprocket is inserted into a first transfer hole of the first carrier tape or a second transfer hole of the second carrier tape.

The chip mounting apparatus may include a pick-up nozzle for picking up a first component of the first carrier tape or a second component of the second carrier tape, wherein the pick-up nozzle may be disposed on a center of rotation of the second sprocket.

The carrier tape feeding device may further include: a base frame for forming an external appearance, wherein the detecting sensor unit, the transfer unit, the rotation unit, and the controller may be provided in the base frame; and a connection detecting sensor unit for detecting a connection between the chip mounting apparatus and the base frame, by being provided to the base frame.

When nonexistence of the first carrier tape is determined based on a signal detected by the detecting sensor unit, the controller may control the rotation unit to transfer the second carrier tape from the rotation unit to the transfer unit.

When existence of the first carrier tape is detected by the detecting sensor unit, the controller may drive the transfer unit to supply the first carrier tape to the chip mounting apparatus.

When it is determined that supply of the first carrier tape is completed based on a signal detected by the detecting sensor unit, the controller may drive the transfer unit for a first period of time so as to supply the first carrier tape to the chip mounting apparatus.

The carrier tape feeding device may further include an alarm unit for providing information to an external user via sound or an image.

When nonexistence of the second carrier tape is detected by the detecting sensor unit, the controller may control the alarm unit to provide information about the nonexistence of the second carrier tape to the external user.

According to another embodiment of the present invention, there is provided a carrier tape feeding device including: a body unit comprising a single feeding hole into which a plurality of carrier tapes are fed, and a cover tape removing unit for picking up components embedded in the plurality of carrier tapes; a transfer module for transferring a first carrier tape towards the cover tape removing unit; a carrier tape loading unit connected to the transfer module to transfer a second carrier tape that is subsequently fed to the transfer module when the first carrier tape is completely transferred to the transfer module; a detecting sensor unit for detecting sequential existence of the first carrier tape or the second carrier tape transferred from the transfer module, and existence of the second carrier tape supplied to the carrier tape loading unit; and a controller for determining existence of the first carrier tape based on a signal detected by the detecting sensor unit, and controlling at least one of components of the transfer module based on the existence of the first carrier tape.

The carrier tape loading unit may restrict the second carrier tape from being transferred to the cover tape removing unit while the first carrier tape is connected to the transfer module, and connect a second transfer hole of the second carrier tape to the transfer module when the first carrier tape is released from the transfer module.

An end of the carrier tape loading unit may be inserted into at least one of second transfer hole formed at regular intervals on a side portion of the second carrier tape to restrict the transfer of the second carrier tape.

The first and second carrier tapes may respectively include first and second cover tapes combined to close one surfaces of the first and second carrier tapes, and the carrier tape feeding device may further include a cover tape removing unit spaced apart from the transfer module in a predetermined interval and removing the first cover tape of the first carrier tape or the second cover tape of the second carrier tape only from one direction to rotate the first cover tape or the second cover tape at a predetermined angle.

The cover tape removing unit may include: a tape support unit extending along a transfer direction of a carrier tape having one surface to which a cover tape is separably attached, and adhered to a top surface of the carrier tape; a separation unit for separating a first side portion of the cover tape in a length direction from the carrier tape; a bending guide unit for guiding the first side portion of the cover tape separated from the carrier tape to bend away from a separated portion of the carrier tape; and a folding guide unit for folding the separated first side portion of the cover tape over a second side portion of the cover tape, which is not separated from the carrier tape, to drop the first side portion downward.

The bending guide unit may include a first rod member extending from a top of the separation unit towards an edge of the tape support unit and a second rod member extending along an extending direction of the tape support unit to cross the first rod member.

The first rod member may include a first extending unit extending while tilting with respect to the transfer direction of the carrier tape, and a second extending unit bent towards a bottom of the tape support unit to extend towards a side plate of the folding guide unit at an end of the first extending unit.

The bending guide unit may bend to have a cross section having a semicircle shape opened downward and extend from the separation unit towards an edge of the tape support unit.

The transfer module may include a pair of sprockets respectively disposed in front of and at the rear of the separation unit, and the separation unit may be disposed to cross a straight line extending in the transfer direction of the carrier tape at a contact point of the pair of sprockets and the carrier tape.

The first side portion of the cover tape may rotate at least 180 and be folded to drop downward over the second side portion of the cover tape, which is not separated from the carrier tape.

According to another embodiment of the present invention, there is provided a chip mounting system including: a carrier tape feeding device for supplying at least two carrier tapes; a chip mounting apparatus for picking up a component of the at least two carrier tapes supplied from the carrier tape feeding device and surface-mounting the picked up components on an external electronic device; a marking recognition unit for recognizing a marking formed on the at least two carrier tapes by being provide in at least one of the carrier tape feeding device and the chip mounting apparatus; and a control apparatus for storing mounting information based on the marking of the at least two carrier tapes recognized by the marking recognition unit, by being provide in at least one of the carrier tape feeding device and the chip mounting apparatus.

The carrier tape feeding device may include: a body unit including a single feeding hole into which a plurality of carrier tapes are fed, and a cover tape removing unit for picking up components embedded in the plurality of carrier tapes; a transfer module for transferring a first carrier tape towards the cover tape removing unit; a carrier tape loading unit connected to the transfer module to transfer a second carrier tape that is subsequently fed to the transfer module when the first carrier tape is completely transferred to the transfer module; a detecting sensor unit for detecting sequential existence of the first carrier tape or the second carrier tape transferred from the transfer module, and existence of the second carrier tape supplied to the carrier tape loading unit; and a controller for determining existence of the first carrier tape based on a signal detected by the detecting sensor unit, and controlling at least one of components of the transfer module based on the existence of the first carrier tape.

The chip mounting apparatus may include: an accommodation unit where the carrier tape feeding device is mounted; a pick-up nozzle spaced apart from the accommodation unit in a predetermined interval, and for picking up a component on the plurality of carrier tapes supplied from the carrier tape feeding device; and a second marking recognition unit spaced apart from the pick-up nozzle in a predetermined interval, and for recognizing the plurality of carrier tapes and a marking of the plurality of carrier tapes.

The mounting information may include at least one of information corresponding to an external electronic device, information corresponding to a carrier tape storage apparatus, and information corresponding to a carrier tape.

The chip mounting system may further include an alarm unit for providing information to an external user via sound or an image, wherein the control apparatus may compare the mounting information and predetermined mounting information, and when the mounting information and the predetermined mounting information are different, stop an operation or operate the alarm unit.

The marking may be a quick response (QR)-code.

According to another embodiment of the present invention, there is provided a chip mounting method including: connecting a first carrier tape from among a plurality of carrier tapes to a transfer module after supplying the plurality of carrier tapes to a single feeding hole; transferring the first carrier tape to the chip mounting apparatus by driving at least one component of the transfer module based on existence of the first carrier tape connected to the transfer module detected through a first detecting sensor unit; and connecting a second carrier tape whose transfer is restricted by a carrier tape loading unit from among the plurality of carrier tapes to the transfer module, when the first carrier tape is released from the transfer module.

The chip mounting method may further include: detecting existence of the second carrier tape from a second detecting sensor unit; and connecting and transferring the second carrier tape to the transfer module by only rotating a rotation unit of the transfer module based on the existence of the second carrier tape.

The connecting of the second carrier tape may include connecting the second carrier tape to the transfer module as an end of the carrier tape loading unit is withdrawn from a second transfer hole of the second carrier tape.

The plurality of carrier tapes may include a marking, and the chip mounting method may further include storing mounting information corresponding to the marking by recognizing the marking by a marking recognition unit.

The chip mounting method may further include stopping an operation or externally issuing an alarm when the mounting information and predetermined mounting information are different from each other.

MODE FOR THE INVENTION

The present invention will be clear with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art, and the present invention is only defined by the scope of claims. The terminology used herein is used only to describe specific embodiments and does not have any intention to limit the present invention. An expression in the singular includes an expression in the plural unless the context clearly dictates otherwise. The terms "comprises" and/or "comprising," when used in this specification, specify the presence of stated components, steps, operations, and/or elements, but do not preclude the presence or addition of one or more other components, steps, operations, and/or elements. Though terms like 'first' and 'second' are used to describe various elements, the elements are not limited to these terms. These terms are used only to differentiate an element from another element.

FIG. 1 is a cross-sectional view of a chip mounting system S according to an embodiment of the present invention.

Referring to FIG. 1, the chip mounting system S may include a carrier tape feeding device F for supplying at least two carrier tapes C. Hereinafter, for convenience of description, the carrier tape feeding device F supplies two carrier tapes C.

Meanwhile, the chip mounting system S may include a chip mounting apparatus D where the carrier tape feeding device F is provided. Here, the chip mounting apparatus D may pick up a component of the carrier tape C supplied and transferred from the carrier tape feeding device F and surface-mount the component on an external electronic device (not shown).

Also, the chip mounting system S may include a marking recognition unit (not marked) for recognizing a marking (not marked) formed on the carrier tape C by being provided in at least one of the carrier tape feeding device F and the chip mounting apparatus D.

Here, the marking recognition unit may be provided in the carrier tape feeding device F or the chip mounting apparatus D, or in each of the carrier tape feeding device F and the chip mounting apparatus D. Hereinafter, for convenience of description, the marking recognition unit is provided in the chip mounting apparatus D.

Meanwhile, the chip mounting system S may include a control apparatus (not shown) for storing mounting information based on the marking of the carrier tape C recognized by the marking recognition unit, by being provide in at least one of the carrier tape feeding device F and the chip mounting apparatus D.

Here, the mounting information may include various types of information. For example, the mounting information may include information corresponding to the carrier tape feeding device F, information corresponding to the carrier tape C, and information corresponding to the external electronic device.

Also, the control apparatus may be variously formed. For example, the control apparatus may include a controller (not shown), which is described later, provided in the carrier tape feeding device F. Also, the control apparatus may include a control unit (not shown) provided in the chip mounting apparatus D. Hereinafter, for convenience of description, the control apparatus includes the controller and the control unit provided in the carrier tape feeding device F.

The chip mounting apparatus D may include an accommodation unit D2 where the carrier tape feeding device F is mounted. Also, the chip mounting apparatus D may include a pick-up nozzle D1 for picking up a first component (not shown) in a first carrier tape 3 or a second component (not shown) in a second carrier tape 1. In detail, the chip mounting apparatus D may supply the first or second component picked up by the pick-up nozzle D1 to the external electronic device.

The chip mounting apparatus D may include a second marking recognition unit E2 spaced apart from the pick-up nozzle D1 in a predetermined interval. Here, the second marking recognition unit E2 may be variously formed. In detail, the second marking recognition unit E2 may include a camera. Alternatively, the second marking recognition unit E2 may include a scan unit for scanning the marking. Hereinafter, for convenience of description, the second marking recognition unit E2 includes a camera.

FIG. 2 is a perspective view of the first carrier tape 3 of FIG. 1.

Referring to FIG. 2, the carrier tape feeding device F mounted on a chip mounter continuously supplies a carrier tape (not marked) supplied from a component reel (not shown) as shown in FIG. 1. Here, the carrier tape may include the first carrier tape 3 and a second carrier tape (not shown). Here, the first carrier tape 3 and the second carrier tape may be similarly formed. Hereinafter, for convenience of description, a first component reel 8 and the first carrier tape 3 are mainly described.

About 2000 to about 5000 electronic components may be accommodated in the first component reel 8. A plurality of first storage spaces 3a are formed in the first carrier tape 3 wound around the first component reel 8. A first component 5, such as a semiconductor chip, is accommodated in each of the first storage spaces 3a spaced apart from each other along an extending direction of the first carrier tape 3. A first cover tape 2 is attached to a top of the first carrier tape 3, and seals the first storage spaces 3a accommodating the first components 5. A plurality of first transfer holes 3b are formed at regular intervals at an edge of the first carrier tape 3.

The first carrier tape 3 may include a first marking 6. Here, the first marking 6 may be formed at any location. For example, the first marking 6 may be formed on the first carrier tape 3. Alternatively, the first marking 6 may be formed on one of the first storage spaces 3a where the first component 5 is mounted. Hereinafter, for convenience of description, the first marking 6 is formed on one of the first storage spaces 3a where the first component 5 is mounted.

The first marking 6 may be variously formed. For example, the first marking 6 may include a barcode. Alternatively, the first marking 6 may include a quick response (QR)-code. However, the first marking 6 is not limited thereto and may have any form capable of containing information about the first carrier tape 3 and a carrier tape feeding device (not shown).

Hereinafter, the carrier tape feeding device F will be described in detail.

FIG. 3 is a cross-sectional view of the carrier tape feeding device F according to an embodiment of the present invention.

Referring to FIG. 3, the carrier tape feeding device F may include a base frame 600 in which a single feeding hole (not marked) into which a plurality of carrier tapes are fed and a cover tape removing unit 700 for picking up components embedded in the carrier tapes are formed. Here, the base frame 600 forms an external appearance and may mount therein components for supplying and transferring the carrier tapes.

The plurality of carrier tapes may be two or more carrier tapes. Hereinafter, a case where the plurality of carrier tapes are two carrier tapes will be mainly described for convenience of description. In particular, a case where the plurality of carrier tapes includes the first carrier tape 3 and the second carrier tape 1 will be mainly described.

The carrier tape feeding device F may include a transfer module (not shown) for transferring the first carrier tape 3 towards the cover tape removing unit 700.

The transfer module may include a transfer unit (not marked) for transferring the first carrier tape 3 from among the plurality of carrier tapes towards the cover tape removing unit 700.

Here, the transfer unit may include a first transfer unit 210 for transferring the first carrier tape 3 or the second carrier tape 1 towards the cover tape removing unit 700 by being inserted into the first transfer hole 3b of the first carrier tape 3 or a second transfer hole (not shown) of the second carrier tape 1.

The first transfer unit 210 may include a first sprocket 211 for determining a location of the first carrier tape 3 or the second carrier tape 1 as a part of the first sprocket 211 is inserted into the first transfer hole 3b or second transfer hole. Here, the first sprocket 211 may have a gear shape.

In particular, the first sprocket 211 may determine the location of the first carrier tape 3 or the second carrier tape 1 as well as transferring the first carrier tape 3 or the second carrier tape 1.

In detail, the location of the first carrier tape 3 or the second carrier tape 1 may be limited by being inserted into the first sprocket 211. Also, when the first carrier tape 3 or the second carrier tape 1 is misadjusted or misaligned, the first carrier tape 3 or the second carrier tape 1 may be guided by the cover tape removing unit 700 described later to be mounted on the first sprocket 211.

Also, the first transfer unit 210 may include a first driving unit 212 for rotating the first sprocket 211 by being connected to the first sprocket 211. Here, the first driving unit 212 may include a first driving power transmitter 212b connected to the first sprocket 211. Also, the first driving unit 212 may include a first driving power generator 212a for generating driving power by being connected to the first driving power transmitter 212b.

In detail, the first driving power generator 212a may include a first motor (not shown). Also, the first driving power transmitter 212b may include a first pulley assembly or a first gear assembly connected to the first driving power generator 212a. Hereinafter, for convenience of description, the first driving power transmitter 212b includes the first gear assembly.

The first transfer unit 210 may include a first rotation detecting sensor unit (not shown) for detecting rotation of the first driving unit 212 by being provided in the first driving unit 212. In particular, the first rotation detecting sensor unit may be provided in the first driving power generator 212a.

Here, the first rotation detecting sensor unit may be variously formed to detect the rotation of the first driving unit 212. For example, the first rotation detecting sensor unit may include a hall sensor. Alternatively, the first rotation detecting sensor unit may include an optical sensor to detect the rotation of the first driving power generator 212a. Hereinafter, for convenience of description, the first rotation detecting sensor unit includes the optical sensor.

Meanwhile, the transfer unit may include a second transfer unit 220 for transferring the first carrier tape 3 or the second carrier tape 1 by being inserted into the first transfer hole 3b of the first carrier tape 3b or the second transfer hole of the second carrier tape 1.

Here, the second transfer unit 220 may transfer the first or second carrier tape 3 or 1 while assisting an operation of the cover tape removing unit 700 described later.

The second transfer unit 220 may include a second sprocket 221 for transferring the first or second carrier tape 3 or 1 as a part of the second sprocket 221 is inserted into the first transfer hole 3b or the second transfer hole. Here, the second sprocket 221 may be a gear shape such that a second gear is inserted into the first transfer hole 3b or the second transfer hole.

Also, a center of rotation of the second sprocket 221 may form a straight line with the pick-up nozzle D1 described later. In detail, the pick-up nozzle D1 may be spaced apart from the center of rotation of the second sprocket 221 in a predetermined interval.

Also, the second transfer unit 220 may include a second driving unit 222 for rotating the second sprocket 221 by being connected to the second sprocket 221. Here, the second driving unit 222 may include a second driving power generator 222a and a second driving power transmitter 222b. Since the second driving power generator 222a and the second driving power transmitter 222b are respectively similar to the first driving power generator 212a and the first driving power transmitter 212b, details thereof will be omitted herein.

The second transfer unit 220 may include a second rotation detecting sensor unit (not shown) for detecting rotation of the second driving unit 222 by being provided in the second driving unit 222. In particular, the second rotation detecting sensor unit may detect rotation of the second driving power generator 222a by being provided in the second driving power generator 222a. Here, since the second rotation detecting sensor unit is similar to the first rotation detecting sensor unit described above, details thereof will be omitted herein.

Meanwhile, the first and second transfer units 210 and 220 may rotate to transfer the carrier tape in one direction.

The transfer module may also include a rotation unit 230 for transferring the second carrier tape 1 to the first and second transfer units 210 and 220 when the first carrier tape 3 is completely transferred.

The carrier tape feeding device F may include a carrier tape loading unit 100. Here, the carrier tape loading unit 100 may smoothly supply the plurality of carrier tapes to the transfer module. In particular, the carrier tape loading unit 100 may smoothly supply the second carrier tape 1 to the rotation unit 230.

Also, the carrier tape loading unit 100 may be pivotally connected to the base frame 600. In particular, the carrier tape loading unit 100 may be inserted into a second insertion hole (not shown) of the second carrier tape 1 by pivoting in a direction being away from and then getting close to the base frame 600 when the second carrier tape 1 is fed through the single feeding hole.

The carrier tape feeding device F may include a detecting sensor unit (not marked) for detecting locations or existence of the plurality of carrier tapes. Here, the detecting sensor unit may be prepared in a plural number, and the plurality of detecting sensor units may include a first detecting sensor unit 400 disposed between the first transfer unit 210 and the rotation unit 230 described below. The plurality of detecting sensor units may also include a second detecting sensor unit 500 spaced apart from the first detecting sensor unit 400 in a predetermined interval and disposed at one side of the rotation unit 230.

The first detecting sensor unit 400 may check whether the plurality of carrier tapes are replaced. The second detecting sensor unit 500 may check existence of a new carrier tape after an existing carrier tape is replaced.

The first detecting sensor unit 400 and the second detecting sensor unit 500 may include any type of sensors capable of detecting an object, such as an optical sensor, a magnetic sensor, and an approximate sensor. However, hereinafter, a case where the first detecting sensor unit 400 and the second detecting sensor unit 500 include an optical sensor will be mainly described in detail for convenience of description.

In detail, the first detecting sensor unit 400 may detect a location of an end of the first carrier tape 3 or the existence of the first carrier tape 3 when the end of the first carrier tape 3 is transferred through the rotation unit 230 while the first carrier tape 3 is being transferred.

In particular, the first detecting sensor unit 400 may emit light towards the first carrier tape 3 while the first carrier tape 3 is transferred and may detect the end of the first carrier tape 3 based on whether the light is detected.

Also, the second detecting sensor unit 500 may check existence of the second carrier tape 1 by operating in a similar manner as the operation of the first detecting sensor unit 400.

Meanwhile, the carrier tape feeding device F may include a controller (not shown) for determining existence of the first carrier tape 3 based on a signal detected by the detecting sensor unit. Also, the controller may control at least one component of the transfer module to be driven based on the existence of the first carrier tape 3.

In detail, the controller may control the first and second driving units 212 and 222 to be driven when the first carrier tape 3 exists. On the other hand, the controller may control a third driving unit 230a described later to be driven when the first carrier tape 3 does not exist.

The carrier tape feeding device F may include the third driving unit 230a for rotating the rotation unit 230 by being provided in the rotation unit 230. Here, the third driving unit 230a may include a third motor that is directly connected to the rotation unit 230 to rotate the rotation unit 230.

The carrier tape feeding device F may include a connection detecting sensor unit 600a provided in the base frame 600. Here, the connection detecting sensor unit 600a may detect whether the base frame 600 and the chip mounting apparatus D are connected to each other.

In particular, the connection detecting sensor unit 600a may be variously formed to detect whether the base frame 600 and the chip mounting apparatus D are connected to each other. For example, the connection detecting sensor unit 600a may include a switching circuit to externally generate a signal when the base frame 600 contacts the chip mounting apparatus D. Alternatively, the connection detecting sensor unit 600a may include magnetic sensors to generate a signal when the chip mounting apparatus D and the base frame 600 contact each other.

Hereinafter, the carrier tape loading unit 100 will be described in detail.

FIG. 4 is a conceptual view of the carrier tape loading unit 100 of FIG. 3, according to an embodiment of the present invention.

Referring to FIG. 4, the rotation unit 230 may be engaged with a part of the first carrier tape 3. In particular, the rotation unit 230 may rotate by being engaged with a part of the first carrier tape 3 when the first and second sprockets 211 and 221 operate.

The rotation unit 230 may include a gear tooth (not marked) formed on the outer surface thereof to protrude. Here, a plurality of the gear teeth may be formed along the outer surface of the rotation unit 230. In particular, the gear tooth may be inserted into a first transfer hole (not shown) formed on the first carrier tape 3. In detail, the gear tooth may be inserted into or withdrawn from the first transfer hole while rotating when the first carrier tape 3 moves.

The rotation unit 230 may rotate when the first carrier tape 3 moves as described above or may rotate by using a separate third driving unit (not shown). The third driving unit may include an actuator, such as a motor, capable of generating a driving power. In particular, the third driving unit may selectively rotate the rotation unit 230 by being coupled to the center of rotation of the rotation unit 230.

In detail, as described above, when the first and second transfer units 210 and 220 operate, the rotation unit 230 may passively rotate. However, the rotation unit 230 may actively rotate according to a result measured by the first detecting sensor unit 400.

For example, as described above, when the first detecting sensor unit 400 determines that the first carrier tape 3 has been vanished, the rotation unit 230 may rotate to transfer the second carrier tape 1 to the first and second transfer units 210 and 220. In this case, the third driving unit may generate driving power, and the rotation unit 230 may be rotated by the driving power.

Meanwhile, the carrier tape loading unit 100 may include a handle unit 120, which is spaced apart from an outer circumferential surface of the rotation unit 230 in a predetermined interval and is rotatably mounted on the base frame 600. Here, the handle unit 120 may selectively engage the second carrier tape 1 contacting the outer surface of the first carrier tape 3.

In detail, the handle unit 120 may include a holding part 121 formed for a user to be able to hold. The handle unit 120 may also include a handle body unit 122 formed to extend from the holding part 121 and rotatably mounted on the base frame 600. Here, the holding part 121 may be formed of a synthetic resin material capable of increasing the convenience of the user. In particular, the holding part 121 may be mounted to surround the outer surface of a part of the handle body unit 122.

The handle unit 120 may include an insertion protrusion 123 formed to protrude from the handle body unit 122. Here, the insertion protrusion 123 may be formed to protrude from the handle body unit 122 towards the rotation unit 230. In addition, a plurality of the insertion protrusions 123 may be prepared, wherein the plurality of insertion protrusions 123 may be spaced apart from each other at regular intervals.

In particular, the plurality of insertion protrusions 123 may be formed to be inserted into second transfer holes formed on the second carrier tape 1. Also, intervals between the insertion protrusions 123 may correspond to intervals between the second transfer holes. Thus, the insertion protrusion 123 may restrict the transfer of the second carrier tape 1 by being selectively inserted into the second transfer hole.

A protruding height of the insertion protrusion 123 may be formed to restrict at least two stacked second carrier tapes 1 while the first carrier tape 3 is being engaged with the transfer module.

That is, the protruding height of the insertion protrusion 123 may be formed to be fully inserted into the second transfer hole of the second carrier tape 1, and when two or more carrier tapes, such as the second carrier tapes 1, are stacked, the protruding height of the insertion protrusion 123 may be formed to fully pass through the stacked carrier tapes.

The handle unit 120 may include a movement prevention part 124 formed to protrude from the handle body unit 122 towards the rotation unit 230. In other words, the movement prevention unit 124 may be formed to be multiply stepped from one surface of the handle body unit 122. In this case, the movement prevention unit 124 may be spaced apart from the rotation unit 230 in a predetermined interval.

The movement prevention unit 124 may be formed at a front side than one end of the second carrier tape 3 based on a transfer direction of the first carrier tape 3. Thus, when the first carrier tape 3 is transferred, the movement prevention unit 124 may support the one end of the second carrier tape 1 to prevent the second carrier tape 1 from being transferred.

Meanwhile, the carrier tape loading part 100 may include a block unit 130 rotatably mounted on the base frame 600. Here, the center of rotation of the block unit 130 may match the center of rotation of the rotation unit 230. The block unit 130 may exert a force to the second carrier tape 1 towards the rotation unit 230 according to rotation of the handle unit 120.

In detail, the block unit 130 may be formed so that one end thereof is sloped. Here, a sloped portion of the block unit 130 may be formed to contact the upper surface of the second carrier tape 1. In particular, since a length direction from the center of rotation of the block unit 130 forms a predetermined angle with the outer surface of the second carrier tape 1, a part of the lower surface of the block unit 130 may form a slope to surface-contact the upper surface of the second carrier tape 1.

The carrier tape loading unit 100 may include a location limitation unit 191 formed on any one of the handle unit 120 and the block unit 130 to limit the movement of the block unit 130. Also, the carrier tape loading unit 100 may include a guide unit 195 formed on the other one of the handle unit 120 and the block unit 130 to guide the location limitation unit 191.

The location limitation unit 191 and the guide unit 195 may be variously formed. For example, the location limitation unit 191 may include a location limitation protrusion (not marked) formed to protrude from the outer surface of any one of the handle unit 120 and the block unit 130.

The guide unit 195 may include a guide hole (not marked) formed on the other one of outer surface of the handle unit 120 and the block unit 130 so that the location limitation protrusion is inserted into the guide hole. Here, the guide hole may have an elongated hole shape. Alternatively, the guide hole may have an oval shape.

The guide unit 195 may include a guide groove (not shown) formed on the outer surface of the other one of the handle unit 120 and the block unit 130 in addition to the guide hole described above.

The guide unit 195 may further include a guide protrusion (not shown) formed to protrude from the other one of the outer surface of the handle unit 120 and the block unit 130 so that the location limitation protrusion is inserted into the guide protrusion. Here, a plurality of the guide protrusions may be prepared, wherein the plurality of guide protrusions may face each other while being spaced apart from each other at regular intervals.

The location limitation unit 191 and the guide unit 195 are not limited to the above description and may include any components and structures which limit the movement of the block unit 130. However, hereinafter, for convenience of description, a case where the location limitation unit 191 includes the location limitation protrusion while the guide unit 195 includes the guide hole will be mainly described. In addition, a case where the location limitation unit 191 is formed on the outer surface of the handle unit 120 while the guide unit 195 is formed on the outer surface of the block unit 130 will be mainly described.

The carrier tape loading part 100 may include a first elastic unit 150 disposed between the handle unit 120 and the block unit 130. Here, the first elastic unit 150 may exert a force to the handle unit 120 and the block unit 130 in a direction in which a part of the handle unit 120 gradually recedes from the block unit 130.

The first elastic unit 150 may be variously formed. For example, the first elastic unit 150 may include a bar-shaped rubber elastic body formed of a rubber material. Alternatively, the first elastic unit 150 may include a torsion spring mounted at the center of rotation of the handle unit 120 and the block unit 130. Alternatively, the first elastic unit 150 may include a compression spring. Hereinafter, for convenience of description, a case where the first elastic unit 150 includes the compression spring will be mainly described in detail.

Here, a first insertion groove (not shown) may be formed on the handle unit 120 and the block unit 130 so that both ends of the first elastic unit 150 are respectively inserted into the first insertion grooves formed on the handle unit 120 and the block unit 130. Thus, the first elastic unit 150 may accurately exert a force to the handle unit 120 and the block unit 130.

The carrier tape loading unit 100 may include a deviation prevention member 160 disposed between the handle unit 120 and the block unit 130 to prevent the first elastic unit 150 from being deviated. The deviation prevention member 160 may be provided to penetrate through the first elastic unit 150 and to be inserted into any one of the handle unit 120 and the block unit 130. In particular, the deviation prevention member 160 may maintain a rotation angle difference between the handle unit 120 and the block unit 130 within a predetermined range when the handle unit 120 or the block unit 130 rotates.

The carrier tape loading unit 100 may include a connection member 170 for connecting the handle unit 120 to the base frame 600. Here, the connection member 170 may be spaced apart from the center of rotation of the handle unit 120 in a predetermined interval. In particular, the connection member 170 may limit the rotation of the handle unit 120 within a predetermined range by being provided on one end of the handle unit 120 to connect the handle unit 120 to the base frame 600. Alternatively, the connection member 170 may have a bolt shape and be provided on the base frame 600.

The carrier tape loading unit 100 may include a second elastic unit 180 disposed between the handle unit 120 and the base frame 600. Here, the second elastic unit 180 may exert a force to the handle unit 120 in a direction opposite to a rotation direction of the handle unit 120 when the handle unit 120 rotates.

The second elastic unit 180 may be variously formed. For example, the second elastic unit 180 may include a bar-shaped rubber elastic body formed of a rubber material. Alternatively, the second elastic unit 180 may include a torsion spring provided at the center of rotation of the handle unit 120. Alternatively, the second elastic unit 180 may include a compression spring. Hereinafter, for convenience of description, a case where the second elastic unit 180 includes the compression spring will be mainly described in detail.

The second elastic unit 180 may be provided at a place where the connection member 170 is provided. In detail, the second elastic unit 180 may be provided between the handle unit 120 and the base frame 600 so that the connection member 170 is inserted into the second elastic unit 180. Here, a second insertion groove (not shown) may be formed on the handle unit 120 and the base frame 600 so that parts of both ends of the second elastic unit 180 are respectively inserted into and mount on the second insertion grooves.

Hereinafter, an operation of the carrier tape loading unit 100 will be described in detail.

FIG. 5 is a conceptual view for describing a first operation of the carrier tape loading unit 100 of FIG. 4. FIG. 6 is a conceptual view for describing a second operation of the carrier tape loading unit 100 of FIG. 4.

Referring to FIGS. 5 and 6, the transfer module may be formed to transfer the first carrier tape 3 towards the cover tape removing unit 700.

Also, the carrier tape loading unit 100 may be functionally connected to the transfer module so as to connect the second carrier tape 1 that is subsequently fed to the transfer module when the first carrier tape 3 is released from the transfer module.

In particular, the carrier tape loading unit 100 may restrict the transfer of the second carrier tape 1 to the cover tape removing unit 700 while the first carrier tape 3 and the transfer module are connected to each other.

In detail, the carrier tape loading unit 100 may restrict the transfer of the second carrier tape 1 to the cover tape removing unit 700 as an end of the carrier tape loading unit 100 is inserted into the second transfer holes formed at regular intervals at the side portion of the second carrier tape 1.

Also, the carrier tape loading unit 100 may connect the second transfer hole of the second carrier tape 1 to the transfer module when the first carrier tape 3 is released from the transfer module. In detail, the carrier tape loading unit 100 may connect the second transfer hole of the second carrier tape 1 to the transfer module as the end of the carrier tape loading unit 100 is withdrawn from the second transfer hole.

To operate the carrier tape feeding device F, a user may provide a first winding roll (not shown) around which the first carrier tape 3 is wound outside the carrier tape feeding device F. Also, the user may provide a second winding roll (not shown) around which the second carrier tape 1 is wound outside the carrier tape feeding device F.

Here, the first carrier tape 3 may be withdrawn from the first winding roll and be provided in the carrier tape feeding device F. In detail, the first carrier tape 3 may be inserted inside the carrier tape feeding device F through the single feeding hole formed on the base frame 600 and be engaged with the outer surfaces of the rotation unit 230 and the first and second sprockets 211 and 221.

Here, the gear tooth of the rotation part unit, the gear tooth of the first sprocket 211, and the gear tooth of the second sprocket 221 may be inserted into some of the first transfer holes 3b formed on the first carrier tape 3.

After the above operation is completed, the second carrier tape 1 may be withdrawn from the second winding roll and be inserted into the carrier tape feeding device F. Here, the second carrier tape 1 may be inserted into the carrier tape feeding device F along the outer surface of the first carrier tape 3. When the second carrier tape 1 is inserted, the second carrier tape 1 may stop at a location where the handle unit 120 is located.

When the second carrier tape 1 is inserted as described above, the user may rotate the handle unit 120. In detail, when the user retains the holding part 121 and exerts a force to the holding part 121, the handle body unit 122 may rotate along with rotation of the holding part 121.

When the handle body unit 122 rotates, the handle body unit 122 may rotate in a first direction around the base frame 600. Here, the location limitation unit 191 may rotate along with the rotation of the handle body unit 122.

The location limitation unit 191 may move along the inside of the guide hole of the guide unit 195 by a predetermined distance while rotating. Here, when the location limitation unit 191 arrives at an end of the guide hole, the location limitation unit 191 may exert a force to the block unit 130. In this case, the block unit 130 may rotate in the first direction together with the handle body unit 122 by the location limitation unit 191.

When the handle body unit 122 and the block unit 130 move as described above, the second elastic unit 180 may exert a force to the handle body unit 122 in a second direction opposite to the first direction. In this case, the second elastic unit 180 may be compressed by the movement of the handle body unit 122.

When the handle body unit 122 is rotated in the first direction through the holding part 121, a space may be formed between the block unit 130 and the first carrier tape 3. At this time, one end of the second carrier tape 1 may be disposed at one side of the block unit 130 through the space.

After the second carrier tape 1 is completely disposed as described above, the user may rotate the handle unit 120 in the second direction. At this time, as described above, the second elastic unit 180 may exert a force to the handle body unit 122 in the second direction to help the rotation of the handle unit 120.

When the handle unit 120 rotates in the second direction as described above, the block unit 130 may also rotate in the second direction. At this time, the first elastic unit 150 may exert a force to separate the block unit 130 and the handle body unit 122 from each other.

When the handle unit 120 and the block unit 130 rotate as described above, a rotation angle of the handle unit 120 may be limited. In detail, when the handle unit 120 rotates in the second direction, the handle body unit 122 may contact a part of the connection member 170.

Here, a cross-sectional area of one end of the connection member 170 may be formed differently from cross-sectional areas of the other portions of the connection member 170. For example, the cross-sectional area of the one end of the connection member 170 may be formed to be larger than the cross-sectional areas of the other portions of the connection member 170.

Thus, since the handle body unit 122 does not rotate any more when the handle body unit 122 arrives at the one end of the connection member 170 while rotating in the second direction, a rotation angle of the handle body unit 122 may be limited. In particular, by limiting the rotation of the handle body unit 122, the connection member 170 may prevent the second carrier tape 1 from being damaged due to an excessive press of the handle unit 120 onto the second carrier tape 1.

When the handle body unit 122 rotates as described above, the insertion protrusion 123 may be inserted into the second transfer hole formed on the second carrier tape 1. Thus, the second carrier tape 1 may be engaged with the handle unit 120 through the insertion protrusion 123.

In addition, when the handle body unit 122 rotates as described above, the block unit 130 may contact the outer surface of the second carrier tape 1. In particular, the sloped lower surface of the block unit 130 may contact the upper surface of the second carrier tape 1.

At this time, the block unit 130 may rotate in the first direction by a predetermined angle while contacting the outer surface of the second carrier tape 1. In detail, the block unit 130 may rotate in the first direction in proportional to a thickness of the second carrier tape 1.

In particular, when the block unit 130 rotates in the first direction as described above, the first elastic unit 150 may exert a force to the block unit 130 towards the rotation unit 230. In this case, the block unit 130 is completely adhered to the second carrier tape 1 and may exert a force to the second carrier tape 1 towards the rotation unit 230 and the first carrier tape 3. In particular, the second carrier tape 1 may move in a transfer direction of the first carrier tape 3 together with the first carrier tape 3 according to an external force, such as a frictional force, while the first carrier tape 3 is being transferred.

In this case, the insertion protrusion 123 may primarily prevent the second carrier tape 1 from being transferred together with the first carrier tape 3 by being engaged with the second carrier tape 1. In addition, when the second carrier tape 1 is released from the insertion protrusion 123, the movement prevention unit 124 may prevent the second carrier tape 1 from being transferred.

Thus, while the first carrier tape 3 is continuously being transferred to an external chip mounting apparatus (not shown), the second carrier tape 1 may stably maintain a non-moving state.

Meanwhile, when the carrier tape loading unit 100 operates as described above, the first carrier tape 3 may be engaged with the transfer module. In detail, the first carrier tape 3 may be sequentially engaged with the rotation unit 230, the first transfer unit 210, and the second transfer unit 220.

In addition, when the first transfer unit 210 and the second transfer unit 220 operate, the first carrier tape 3 may be transferred while being engaged with the transfer module. Here, as described above, an end of the carrier tape loading unit 100 may restrict the second carrier tape 1 from being transferred to the cover tape removing unit 700 by being inserted into the second transfer hole of the second carrier tape 1.

While the carrier tape loading unit 100 is operating as described above, the first carrier tape 3 wound around the first winding roll may be fully vanished. In particular, when the first carrier tape 3 is fully vanished, the first carrier tape 3 may be released from the transfer module. At this time, the first detecting sensor unit 400 may determine whether the first carrier tape 3 is vanished.

In detail, the first detecting sensor unit 400 may externally generate a signal when the first carrier tape 3 is fully vanished. For example, the first detecting sensor unit 400 may check existence of the first carrier tape 3 since light is not detected by the optical sensor when the first carrier tape 3 exists. On the contrary, when the first carrier tape 3 does not exist, the first detecting sensor unit 400 may check nonexistence of the first carrier tape 3 since light is detected by the optical sensor.

As described above, when first detecting sensor unit 400 determines that the first carrier tape 3 does not exist, the carrier tape loading unit 100 may supply the second carrier tape 1 to the transfer module.

When the second carrier tape 1 is supplied as described above, the second carrier tape 1 may be engaged with the transfer module. In particular, the second carrier tape 1 may be engaged with the rotation unit 230. In particular, in this case, the insertion protrusion 123 may be released from the second transfer hole of the second carrier tape 1. At this time, the gear tooth of the rotation unit 230 may be inserted into the second transfer hole of the second carrier tape 1, thereby engaging the second carrier tape 1 with the rotation unit 230.

After the second carrier tape 1 is engaged with the rotation unit 230, the rotation unit 230 may be rotated. In this case, the carrier tape feeding device F may include a controller (not shown) for determining a signal and controlling rotation of the rotation unit 230 to control the rotation unit 230.

As described above, when the first carrier tape 3 is vanished, the second carrier tape 1 may be supplied to the rotation unit 230. In detail, when the first carrier tape 3 is fully vanished, the second carrier tape 1 may not contact the first carrier tape 3. At this time, the block unit 130 receiving a force towards the rotation unit 230 by the first elastic unit 150 may exert a force to the second carrier tape 1 towards the rotation unit 230.

The second carrier tape 1 may be supplied to the rotation unit 230 by the force. At this time, the block unit 130 may be limited in its supply path, i.e., its rotation angle, by the location limitation unit 191 and the guide unit 195.

In detail, when the second carrier tape 1 contacts the first carrier tape 3, the location limitation unit 191 may be located at a central portion of the guide unit 195. On the contrary, when the second carrier tape 1 does not contact the first carrier tape 3, the location limitation unit 191 may not move any more by contacting one end of the guide unit 195 by a force exerted by the first elastic unit 150.

In particular, when the location limitation protrusion is inserted into the guide hole, the location limitation protrusion may move from the central portion of the guide hole to one end of the guide hole and stop there. As described above, an interaction between the location limitation unit 191 and the guide unit 195 may prevent the block unit 130 from exerting an excessive force to the second carrier tape 1.

As described above, when the second carrier tape 1 is engaged with the rotation unit 230, the controller may rotate the rotation unit 230. In this case, the first detecting sensor unit 400 may detect a start point of the second carrier tape 1. Since a method of detecting the start point of the second carrier tape 1 is similar as described above, a detailed description thereof is omitted.

The controller may calculate a time or a distance until the start point of the second carrier tape 1 arrives at the first and second transfer units 210 and 220 based on the value detected by the first detecting sensor unit 400.

The controller may control at least one of a rotation speed, a rotation time, and a rotation angle of the rotation unit 230 based on the calculated time or distance. When the rotation unit 230 rotates, the second carrier tape 1 may be transferred to the first and second transfer units 210 and 220.

According to a conventional carrier tape supplying method, a worker should wait until the first carrier tape 3 being fed is almost vanished and connect the start point of the second carrier tape 1 to be subsequently fed to an end point of the first carrier tape 3 by using an exclusive connection tape or the like.

However, in the carrier tape feeding device F according to an embodiment of the present invention, by loading the second carrier tape 1 to be subsequently fed at any time to the chip mounting apparatus and pushing the handle unit 120 in the second direction, the second carrier tape 1 may wait and automatically be supplied when the first carrier tape 3 is vanished, and thus, a work amount and a work time required to supply carrier tapes may be reduced.

In addition, according to the conventional carrier tape supplying method, since accuracy is required for a process of connecting the start point of the second carrier tape 1 to the end point of the first carrier tape 3, when a non-skilled worker works, a loss of components to be surface-mounted may occur in the connection part.

However, in the carrier tape feeding device F according to an embodiment of the present invention, a separate tape connection work is unnecessary, and a plurality of carrier tapes may be simply and automatically supplied, thereby reducing a product loss caused by a work of a non-skilled worker.

FIG. 7 is a conceptual view of the carrier tape loading unit 100 of FIG. 3, according to another embodiment of the present invention.

Referring to FIG. 7, a carrier tape loading unit 100' may include a handle unit 120', a block unit 130', a rotation unit 230', a first elastic unit 150', a deviation prevention member 160', a connection member 170', a second elastic unit 180', a location limitation unit 191', and a guide unit 195'. Since the handle unit 120', the block unit 130', the rotation unit 230', the first elastic unit 150', the deviation prevention member 160', the connection member 170', the second elastic unit 180', the location limitation unit 191', and the guide unit 195' are similar to those described above, details thereof are omitted herein.

Meanwhile, the handle unit 120' may include a holding part 121', a handle body unit 122', an insertion protrusion 123', and a movement prevention unit 124'. Since the holding part 121', the handle body unit 122', and the movement prevention unit 124' are similar to those described above, details thereof are omitted herein.

The carrier tape loading unit 100' may supply a plurality of carrier tapes as described above. For example, the carrier tape loading unit 100' may supply three or more carrier tapes.

In this case, while the first carrier tape 3 is being transferred, the second carrier tape 1 and third carrier tape 10 may simultaneously stand by at the carrier tape loading unit 100'.

The carrier tape loading unit 100' may supply the second carrier tape 1 as described above after the first carrier tape 3 is completely transferred. Also, when the second carrier tape 1 is completely transferred, the second carrier tape 1 may be transferred to the first and second transfer units 210 and 230 by the rotation unit 230.

Meanwhile, when the second carrier tape 1 is completely transferred after the second carrier tape 1 is supplied, an operation which is similar to the operation after the first carrier tape 3 is completely transferred may be performed.

In detail, when the second carrier tape 1 is completely transferred, the third carrier tape 10 may be supplied to the rotation unit 230' by the block unit 130'. Also, the rotation unit 230' may rotate to transfer the third carrier tape 10 to the first and second sprockets 211 and 221.

In particular, while the first carrier tape 3, the second carrier tape 1, and the third carrier tape 10 are being sequentially transferred, the block unit 130' exert a force to the second carrier tape 1 and the third carrier tape 10 to be supplied to the rotation unit 230'.

Thus, the carrier tape feeding device F may sequentially supply the first carrier tape 3, the second carrier tape 1, and the third carrier tape 10 to the rotation unit 230' through the block unit 130', thereby sequentially supplying carrier tapes to the chip mounting apparatus without having to replace carrier tapes.

In particular, the carrier tape feeding device F may quickly and smoothly perform a surface-mounting process by sequentially supplying carrier tapes as described above.

FIG. 8 is a perspective view schematically illustrating a combination relationship of some components of the cover tape removing unit 700 of FIG. 1. FIG. 9 is an exploded perspective view of some components of the cover tape removing unit 700 of FIG. 8. FIG. 10 is a perspective view schematically illustrating an operation state of the cover tape removing unit 700 of FIG. 8.

Referring to FIGS. 8 through 10, the cover tape removing unit 700 includes a tape support unit 710 extending along the transfer direction of the carrier tape 3 and guiding movement of the carrier tape 3, a separation unit 720 formed in the tape support unit 710 to separate a part of the first cover tape 2, a bending guide unit 730 guiding deformation and movement of the part of the first cover tape 2 separated from the first carrier tape 3, and a folding guide unit 740 guiding folding of the deformed part of the first cover tape 2 to a side of the first carrier tape 3.

The tape support unit 710 extends in the transfer direction of the first carrier tape 3, i.e., in the X-axis direction of FIG. 3, and is formed of a material such as synthetic resin or a metal plate. The tape support unit 710 guides the first carrier tape 3 to move along the X-axis direction.

The tape support unit 710 includes the separation unit 720 for separating the part of the first cover tape 2 at an edge of the first carrier tape 3. In the current embodiment, the separation unit 720 is formed by cutting a part of the tape support unit 710. However, a method of forming the separation unit 720 is not limited thereto, and the separation unit 720 may be separately manufactured from the tape support unit 710, and combined with the tape support unit 710 via welding or by using a coupling unit, such as a rivet, a bolt, and adhesive.

The bending guide unit 730 guides bending of the part of the first cover tape 2 separated from the first carrier tape 3 so that the part of the first cover tape 2 is away from the first carrier tape 3. The bending guide unit 730 may include a first plate 731 and a second plate 732 disposed on top of the separation unit 720. In the current embodiment, the bending guide unit 730 includes two plates, i.e., the first and second plates 731 and 732, but the number of plates is not limited thereto and may be one or may be increased to more than two.

The first plate 731 and the second plate 732 respectively include a first sloping side 731a and a second sloping side 732a, which form different tilt angles $\theta 2$ and $\theta 3$ with respect the transfer direction of the first carrier tape 3. The tilt angle $\theta 3$ of the second sloping side 732a of the second plate 732 may be larger than the tilt angle $\theta 2$ of the first sloping side 731a of the first plate 731 ($\theta 3 > \theta 2$).

The folding guide unit 740 includes a top plate 741 covering a top surface of the second plate 732 and a side plate 742 extending downward from the top plate 741 to cover a side of another edge 710a of the tape support unit 710.

The top plate 741 includes a third sloping side 741a tilting with respect to the transfer direction of the first carrier tape 3. A tilt angle θ4 of the third sloping side 741a may be larger than the tilt angle θ3 of the second sloping side 732a of the second plate 732 (θ4>θ3).

The tape support unit 710 may be combined with a top of the base frame 600. The base frame 600 includes the first sprocket 211 and the second sprocket 221. The first and second sprockets 211 and 221 move the first carrier tape 3 while contacting the first carrier tape 3 by being disposed below the tape support unit 710.

The tape support unit 710 includes long holes 711 and 712 at locations corresponding to gear teeth 211a and 221a of the first and second sprockets 211 and 221. The long holes 711 and 712 also extend along the transfer direction of the first carrier tape 3. The first and second sprockets 211 and 221 are disposed on a straight line L2 extending along the transfer direction of the first carrier tape 3 at a location corresponding to the first transfer hole 3b of the first carrier tape 3.

The tape support unit 710 includes a pick-up hole 713 for externally exposing the region of the first carrier tape 3 from which the first cover tape 2 is removed.

The separation unit 720 is disposed at one edge 710b of the tape support unit 710 to form a tilt angle θ1 with respect to the transfer direction of the first carrier tape 3. The separation unit 720 is disposed to cross a straight line L1 extending along the transfer direction of the first carrier tape 3 from a contact point P1 of the first sprocket 211 and the first carrier tape 3.

In order to guide easy bending of the part of the first cover tape 2 from which the first plate 731 is separated, the tilt angle θ2 of the first sloping side 731a of the first plate 731 may be smaller than the tilt angle θ1 of the separation unit 720 (θ1>θ2).

At least some of the tape support unit 710 and first carrier tape 3 may vibrate with respect to the base frame 600 while the first carrier tape 3 is provided in the X-axis direction while the tape support unit 710 is combined with the base frame 600, the part of the first cover tape 2 is separated from the first carrier tape 3, and the first component 5 is picked up by a pick-up nozzle 7a of a head assembly 7 from the first carrier tape 3.

Since the first carrier tape 3 needs to stably move even while the first component 5 is picked up as the tape support unit 710 moves the first carrier tape 3, a mutual location change between the tape support unit 710 and the first sprocket 211 is designed to be reduced at the contact point P1 of the tape support unit 710, the first carrier tape 3, and the first sprocket 211. In other words, a location change of the tape support unit 710 and the first sprocket 211 with respect to the base frame 600 at the contact point P1 is reduced.

As described above, since the separation unit 720 is disposed at the one edge 710b of the tape support unit 710 so as to cross the straight line L1 passing the contact point P1 and extending along the transfer direction of the first carrier tape 3, the separation unit 720 may stably separate the part of the first cover tape 2 from the first carrier tape 3 while the first carrier tape 3 is transferred. Also, since the first carrier tape 3 is stably transferred to the separation unit 720 while the first and second sprockets 211 and 221 contact the first carrier tape 3 respectively in front of and at the rear of the separation unit 720, vibration generated when the first cover tape 2 is separated may be reduced.

FIG. 11 is a cross-sectional view taken along line XI-XI of the cover tape removing unit 700 of FIG. 10. FIG. 12 is a cross-sectional view taken along line XII-XII of the cover tape removing unit 700 FIG. 10.

Referring to FIGS. 11 and 12, when the first carrier tape 3 moves along the X-axis direction by being guided by the tape support unit 710, the part of the first cover tape 2 attached to the top surface of the first carrier tape 3 is separated by the separation unit 720. Since the separation unit 720 is tilted with respect to the transfer direction of the first carrier tape 3, the first cover tape 2 is separated from the one edge 710b of the tape support unit 710.

In FIG. 11, a region of the first cover tape 2 separated from the first carrier tape 3 is shown as a first separated portion 2b (first side portion) and a region of the first cover tape 2 attached to the first carrier tape 3 is shown as a first attached portion 2a (second side portion).

The first separated portion 2b of the first cover tape 2 separated from the first carrier tape 3 is guided by the bending guide unit 630 to be away from the first carrier tape 3 and bend towards the other edge 710a of the tape support unit 710 to turnover with respect to the first attached portion 2a of the first cover tape 2. The separated portion 2b of the first cover tape 2 bent by the bending guide unit 730 is folded at the edge of the first carrier tape 3 by the folding guide unit 740. In other words, the first cover tape 2 is folded by the folding guide unit 740 such that a surface 2b-1 of the first separated portion 2b of the first cover tape 2, which faced upward when the first cover tape 2 was attached to the first carrier tape 3, is dropped down over the first attached portion 2a and faces a side 3d of the edge of the first carrier tape 3.

The first attached portion 2a of the first cover tape 2 is continuously attached to the first carrier tape 3 while a part of the first separated portion 2b of the first cover tape 2 is folded, and the other surface 2b-2 of the first separated portion 2b of the first cover tape 2, which was attached to the first carrier tape 3 before being separated from the first carrier tape 3, faces the side plate 742 of the folding guide unit 740.

Since the folded first cover tape 2 is guided and discharged into the side plate 742 by the side plate 742, the part of the first cover tape 2 separated from the first carrier tape 3 may be prevented from being deviated outside the carrier tape feeding device F.

Also, some components may move along the first cover tape 2 while being adhered to the first cover tape 2 that is bent by the bending guide unit 730, due to static electricity, during a predetermined period of time after the first cover tape 2 is separated. In this case, since the components adhered to and moving with the first cover tape 2 fall down to the folded side of the first cover tape 2, the components do not interfere with the movement of the first carrier tape 3.

FIG. 13 is a perspective view schematically illustrating an operation relationship of the first carrier tape 3 and the first cover tape 2 in the cover tape removing unit 700 of FIG. 10. FIG. 14 is a cross-sectional view taken along line XIV-XIV of the first carrier tape of FIG. 13;

FIG. 15 is a cross-sectional view taken along line XV-XV of the first carrier tape of 3 FIG. 13. FIG. 16 is a cross-sectional view taken along line XVI-XVI of the first carrier tape 3 of FIG. 13. For convenience of description, some components shown in previous drawings are not shown in FIGS. 13 through 16.

Referring to FIGS. 13 through 16, the part of the first cover tape 2 is separated from the first carrier tape 3 by the separation unit 720 disposed in the middle of a path for providing the first carrier tape 3 in the X-axis direction. As shown in FIG. 14, when the first carrier tape 3 reaches the separation unit 720, the part of the first cover tape 2 on the surface of the first carrier tape 3 is separated.

Referring to FIG. 15, the first separated portion 2b of the first cover tape 2 separated from the first carrier tape 3 is bent to be away from the first carrier tape 3. The first cover tape 2 may bend by an angle in a range from 225 to 315 with respect to the first carrier tape 3.

Referring to FIG. 16, the first separated portion 2b of the first cover tape 2 is folded to the side of the first carrier tape 3. Referring to FIGS. 15 and 16, since the first attached portion 2a of the first cover tape 2 is continuously attached to the surface of the first carrier tape 3 while the first separated portion 2b of the first cover tape 2 is folded, the first carrier tape 3 and the first cover tape 2 may be discharged outside the carrier tape feeding device F together after components are picked up from the first carrier tape 3.

Widths of the first carrier tape 3 and first cover tape 2 may increase or decrease according to sizes of components provided in the first carrier tape 3. In the carrier tape feeding device F described above, since the first separated portion 2b of the first cover tape 2 is discharged while being folded to the side of the first carrier tape 3, while the first attached portion 2a of the first cover tape 2 is attached to the first carrier tape 3, a width increase of the carrier tape feeding device F may be reduced even when the widths of the first carrier tape 3 and first cover tape 2 are wide.

In this case, an installation space of the carrier tape feeding device F may be reduced when the plurality of carrier tape feeding devices F are disposed in parallel in one chip mounter, and thus productivity per unit area of the chip mounter may be improved.

FIG. 17A is a cross-sectional view schematically illustrating an operation state wherein the first cover tape 2 is separated from the first carrier tape 3 by the cover tape removing unit 700 of FIG. 10. FIG. 17B is a cross-sectional view at a different angle from FIG. 17A.

Referring to FIGS. 17A and 17B, as shown in FIG. 17A, as the first carrier tape 3 passes through the separation unit 720, the part of the first cover tape 2 becomes the first separated portion 2b by being separated from the first carrier tape 3, and the remaining part of the first cover tape 2 becomes the first attached portion 2a that is attached to the first carrier tape 3.

The separation unit 720 is tilted with respect to the transfer direction of the first carrier tape 3, in a thickness direction. In other words, a thickness of the separation unit 720 gradually increases along the transfer direction of the first carrier tape 3. Accordingly, the separation unit 720 includes a sloping side 720a at a front end facing the first carrier tape 3.

In order for the first cover tape 2 to be smoothly separated from the first carrier tape 3, an angle B of the sloping side 720a at the front end of the separation unit 720 with respect to the surface of the first carrier tape 3 may be larger than an angle A of the first cover tape 2 with respect to the surface of the first carrier tape 3 formed as the first cover tape 2 is detached from the first carrier tape 3 by the separation unit 720 (B>A).

If the angle A is larger than the angle B (A>B), the first cover tape 2 may not be smoothly detached from the first carrier tape 3. In FIGS. 17A and 17B, T denotes the thickness of the separation unit 720.

An amount and locations of an adhesive coated between the first cover tape 2 and the first carrier tape 3 when the first cover tape 2 is attached to the first carrier tape 3 may be irregular. Accordingly, in order to smoothly separate the first cover tape 2 from the first carrier tape 3, a width W/2 of the separation unit 720 may be about half a width W of the first cover tape 2 as shown in FIG. 17B.

The first attached portion 2a of the first cover tape 2 should be attached to the edge of the first carrier tape 3 while the first cover tape 2 is separated from the first carrier tape 3. Accordingly, in order for the first attached portion 2a not to be detached from the first carrier tape 3, a thickness T of the separation unit 720 may be designed such that an angle C of the first cover tape 2 detached from the first carrier tape 3 by the separation unit 720 may be smaller than an angle for separating the first attached portion 2a.

According to the carrier tape feeding device F described above, since the first cover tape 2 is separated by the separation unit 720 disposed on a straight line passing the contact point P1 of the first carrier tape 3 and the first sprocket 211, the first cover tape 2 may be precisely and stably separated.

Also, since after the part of the first cover tape 2 is separated from the first carrier tape 3, the first carrier tape 3 and the first cover tape 2 may move forward and be discharged outside the carrier tape feeding device F while the separated portion is folded to the side of the first carrier tape 3, mechanical components for collecting the first cover tape 2 from the carrier tape feeding device F are not required, and thus the structure of the carrier tape feeding device F may be simplified.

FIG. 18 is a perspective view schematically illustrating a cover tape removing unit 800 according to another embodiment of the present invention.

Referring to FIG. 18, the cover tape removing unit 800 includes a tape support unit 810 extending along the transfer direction of the first carrier tape 3 and guiding a movement of the first carrier tape 3, a separation unit 820 formed in the tape support unit 810 to separate the part of the first cover tape 2, a bending guide unit guiding deformation and movement of the part of the first cover tape 2 separated from the first carrier tape 3, and a folding guide unit 840 guiding folding of the deformed part of the first cover tape 2 to the side of the first carrier tape 3.

The tape support unit 810 includes long holes 811 and 812 extending along the transfer direction (a direction parallel to an X-axis) of the first carrier tape 3 so that protruding portions (not shown) of a first sprocket (not shown) and a second sprocket (not shown) pass through the long holes 811 and 812. Also, the tape support unit 810 includes a pick-up hole 813 for externally exposing the region of the first carrier tape 3 from which the first cover tape 2 is separated.

The separation unit 820 is formed at one edge 810b of the tape support unit 810 while having a tilt angle θ8 with respect to the transfer direction of the first carrier tape 3. The separation unit 820 is disposed to cross the straight line L1 extending along the transfer direction of the first carrier tape 3 from the contact point P1 of the first sprocket and the first carrier tape 3.

The bending guide unit includes a first rod member 830 extending from a top of the separation unit 820 towards a side of the tape support unit 810, and a second rod member 833 extending along a side edge of the tape support unit 810 to cross the first rod member 830.

The folding guide unit 840 includes an introducing unit 841 formed at a region corresponding to the first rod member 830 at another edge 810a of the tape support unit 810 and folding the part of the first cover tape 2 bent by the first rod member 830 to the side of the first carrier tape 3, and a side plate 842 extending downward from the other edge 810a of the tape support unit 810 to cover the part of the first cover tape 2 folded to the side of the first carrier tape 3.

The first rod member 830 includes a first extending unit 831 extending while having a tilt angle θ7 with respect to the transfer direction of the first carrier tape 3, and a second extending unit 832 bending downward at an end of the first extending unit 831 and extending towards the side plate 842.

Since the first extending unit 831 of the first rod member 830 is spaced apart from the separation unit 820 upward at a predetermined interval Tc, the part of the first cover tape 2 separated from the first carrier tape 3 by the separation unit 820 is guided by the first extending unit 831 and bent towards the other edge 810a of the tape support unit 810.

The second extending unit 832 may be connected into the side plate 842. For example, an end of the second extending unit 832 may be welded or fixed via an adhesive into the side plate 842, or fixed into the side plate 842 via a separate fixing unit.

As such, since the second extending unit 832 of the first rod member 830 is combined with the side plate 842, the first extending unit 831 may be spaced apart from the top of the separation unit 820 at the predetermine interval Tc while guiding bending of the first cover tape 2.

The part of the first cover tape 2 bent by the first extending unit 831 may be further bent by the second extending unit 832 at a crossing point of the second rod member 833 and the second extending unit 832 so as to cover the side of the edge of the first carrier tape 3.

The part of the first cover tape 2 is guided by the second extending unit 832 while being folded to cover the side of the edge of the first carrier tape 3 and moves between the side plate 842 and the tape support unit 810.

In order for the first extending unit 831 to guide easy bending of the part of the first cover tape 2, the tilt angle θ7 of the first extending unit 831 may be smaller than the tilt angle θ8 of the separation unit 820 (θ8>θ7).

FIG. 19 is a perspective view schematically illustrating some components of a cover tape removing unit 900, according to another embodiment of the present invention. FIG. 20 is a perspective view of the cover tape removing unit 900 of FIG. 19.

Referring to FIGS. 19 and 20, the cover tape removing unit 900 includes a tape support unit 910 extending along the transfer direction of the first carrier tape 3 and guiding the movement of the first carrier tape 3, a separation unit 920 formed in the tape support unit 910 to separate a part of the first cover tape 2, a bending guide unit 930 guiding deformation and bending of the part of the first cover tape 2 separated from the first carrier tape 3, and a folding guide unit 940 guiding folding of the deformed part of the first cover tape 2 to the side of the first carrier tape 3.

The tape support unit 910 includes long holes 911 and 912 extending along the transfer direction (direction parallel to the X-axis) of the first carrier tape 3 so that protruding portions (not shown) of a first sprocket (not shown) and a second sprocket (not shown) pass through the long holes 911 and 912. Also, the tape support unit 910 includes a pick-up hole 913 for externally exposing the region of the first carrier tape 3 from which the first cover tape 2 is separated.

The separation unit 920 is disposed to have a tilt angle θ9 with respect to the transfer direction of the first carrier tape 3. The separation unit 920 is disposed to cross the straight line L1 extending along the transfer direction of the first carrier tape 3 from a contact point P1 of the first sprocket and the first carrier tape 3.

The bending guide unit 930 is bent to have a cross section having a semicircle shape opened downward, and extends towards another edge 910a of the tape support unit 910 from the separation unit 920. The bending guide unit 930 includes a base 933 attached to a top surface of the tape support unit 910, a bending unit 931 bending the first cover tape 2 that is bent towards a top of the base 933 and is separated by the separation unit 920 disposed at one edge 910b of the tape support unit 910 towards the other edge 910a of the tape support unit 910, and a guiding unit 932 guiding the first cover tape 2 bent by the bending unit 931 to the side of the first carrier tape 3.

The first cover tape 2 that is bent by the bending unit 931 and has passed the guiding unit 932 is folded to the side of the first carrier tape 3 by the folding guide unit 940.

The folding guide unit 940 includes an introducing unit 941 folding the part of the first cover tape 2 bent by the bending guide unit 930 at the edge of the tape support unit 910 to the side of the first carrier tape 3, and a side plate 942 extending downward from the other edge 910a of the tape support unit 910 to cover the part of the first cover tape 2 folded to the side of the first carrier tape 3.

FIG. 21 is a conceptual view of the chip mounting system S of FIG. 1. FIG. 22 is a flowchart illustrating a method of controlling the chip mounting system S of FIG. 21. Like reference numerals denote like components.

Referring to FIGS. 21 and 22, when the chip mounting system S is operated, first, the first component reel 8 and a second component reel 8a may be provided in the carrier tape feeding device F. Here, a method of providing the first carrier tape 3 and the second carrier tape 1 in the carrier tape feeding device F may be performed as described above.

Hereinafter, operations of the chip mounting system S after the first and second carrier tapes 3 and 1 are provided will be described in detail.

1. When carrier tape feeding device is operated after first and second carrier tapes are provided.

When the chip mounting system S is operated, the carrier tape feeding device F may be provided in the chip mounting apparatus D. In detail, the carrier tape feeding device F may be mounted and fixed in the accommodation unit D2.

As such, when the carrier tape feeding device F is mounted in the accommodation unit D2, a controller 600b may determine whether the carrier tape feeding device F is accurately mounted in the accommodation unit D2 in operation S111.

In detail, when the carrier tape feeding device F is mounted in the accommodation unit D2, the connection detecting sensor unit 600a may detect a connection between the carrier tape feeding device F and the accommodation unit D2.

In particular, when the carrier tape feeding device F is connected to the accommodation unit D2, a switch of the connection detecting sensor unit 600a may be turned on. When the switch is turned on, the connection detecting sensor unit 600a generates an on signal to transmit the on signal to the controller 600b. Also, when the carrier tape feeding device F is mounted in the accommodation unit D2 as described above, the controller 600b may be connected to the chip mounting apparatus D. In detail, the controller 600b may electrically connect to and exchange a signal with a control unit of the chip mounting apparatus D.

When signals are received from the connection detecting sensor unit 600a and the control unit, the controller 600b may determine that the carrier tape feeding device F is accurately provided in the accommodation unit D2. Here, power may be supplied to the carrier tape feeding device F, in operation S112.

On the other hand, when signals are not received from at least one of the connection detecting sensor unit 600*a* and the control unit, the controller 600*b* may determine that the carrier tape feeding device F is not accurately provided in the accommodation unit D2.

Here, the controller 600*b* may activate the alarm unit or may externally transmit a location alignment warning of the carrier tape feeding device F for an external user, in operation S113.

Meanwhile, as described above, when power is supplied to the carrier tape feeding device F, the controller 600*b* may determine whether a signal is applied from the first detecting sensor unit 400, in operation S114.

The first detecting sensor unit 400 may externally generate a signal when the first carrier tape 3 exists. In detail, when the first carrier tape 3 is provided, light generated by the first detecting sensor unit 400 may be blocked by the first carrier tape 3. In this case, as the light generated by the first detecting sensor unit 400 is blocked by the first carrier tape 3, the first detecting sensor unit 400 may generate and transmit a signal indicating that the first carrier tape 3 exists to the controller 600*b*.

On the other hand, when the first carrier tape 3 does not exist, the light generated by the first detecting sensor unit 400 may not be blocked by the first carrier tape 3. Here, the first detecting sensor unit 400 may generate and transmit a signal indicating that the first carrier tape 3 does not exist to the controller 600*b*.

When the signal is transmitted to the controller 600*b*, the controller 600*b* may determine whether the first carrier tape 3 exists. Here, the controller 600*b* may determine that the first carrier tape 3 does not exist on the first detecting sensor unit 400 during an initial operation, in operation S114.

In detail, when the signal indicating that the first carrier tape 3 exists is generated in the first detecting sensor unit 400, the controller 600*b* may control the third driving unit 230*a* to operate. Here, the controller 600*b* may control the third driving unit 230*a* to rotate at a second speed, in operation S118.

On the other hand, when it is determined that the first carrier tape 3 does not exist by the first detecting sensor unit 400, the controller 600*b* may determine existence of the second carrier tape 1 in operation S115.

Here, the second detecting sensor unit 500 may detect existence of the second or first carrier tape 1 or 3. Since a method of detecting a signal in the second detecting sensor unit 500 is similar to that in the first detecting sensor unit 400, details thereof are not repeated here.

Meanwhile, when it is determined that the second carrier tape 1 does not exist, the controller 600*b* may stop an operation, and notify a user or generate an alarm about no operation through the alarm unit, in operation S124.

However, when the existence of the second carrier tape 1 is detected in the second detecting sensor unit 500, the controller 600*b* may control the third driving unit 230*a* to rotate at a first speed in operation S116.

Here, the third driving unit 230*a* may rotate the rotation unit 230 while rotating at the first speed. As described above, when the rotation unit 230 rotates, the rotation unit 230 may transfer the first carrier tape 3 towards the first detecting sensor unit 400 by being engaged to the first transfer hole 3*b* of the first carrier tape 3.

As described above, the first detecting sensor unit 400 detects the existence of the first carrier tape 3 while the first carrier tape 3 is being transferred. Here, a method of detecting the first carrier tape 3 by the first detecting sensor unit 400 is described above, and thus details thereof are not repeated here.

The controller 600*b* may determine the existence of the first carrier tape 3 in operation S117 based on the result of the first detecting sensor unit 400 detecting the first carrier tape 3. In detail, when the first detecting sensor unit 400 detected the existence of the first carrier tape 3, the controller 600*b* may determine that the first carrier tape 3 is disposed on the first detecting sensor unit 400 based on the result.

When it is determined that the first carrier tape 3 is disposed on the first detecting sensor unit 400, the controller 600*b* may stop an operation of the third driving unit 230*a* and control the third driving unit 230*a* to rotate at the second speed in operation S118. Here, the first and second speeds may be different from each other. In particular, the second speed may be lower than the first speed.

The controller 600*b* may rotate the third driving unit 230*a* at the second speed while transferring the first carrier tape 3 to the first sprocket 211 by a predetermined distance, in operation S119. Here, the controller 600*b* may transfer the first carrier tape 3 by the predetermined distance by controlling a rotation time or a rotation number of the third driving unit 230*a*. Hereinafter, for convenience of description, the controller 600*b* transfers the first carrier tape 3 by the predetermined distance by controlling the rotation time of the third driving unit 230*a*.

The controller 600*b* may control the third driving unit 230*a* to rotate at the second speed for a first period of time. When the third driving unit 230*a* is driven at the second speed for the first period of time, the controller 600*b* may transfer the first carrier tape 3 by the predetermined distance.

Here, a third rotation detecting sensor unit 140*b* may be provided in the third driving unit 230*a* to detect rotation accuracy of the third driving unit 230*a*. Since the third rotation detecting sensor unit 140*b* is the same or similar to the first and second rotation detecting sensor units described above, details thereof are not repeated here.

The controller 600*b* may control the third driving unit 230*a* based on the rotation accuracy of the third driving unit 230*a* measured by the third rotation detecting sensor unit 140*b*.

When the first carrier tape 3 is transferred, the first carrier tape 3 may be transferred to the first and second sprockets 211 and 221 through the first detecting sensor unit 400. Here, the first and second sprockets 211 and 221 may freely rotate. In particular, when the third driving unit 230*a* operates as above, the first transfer hole 3*b* of the first carrier tape 3 may be inserted into the first and second sprockets 211 and 221.

After the first carrier tape 3 is transferred by the predetermined distance, the controller 600*b* may control the third driving unit 230*a* to stop in operation S121. Here, as described above, the first carrier tape 3 may be engaged to the first and second sprockets 211 and 221. In particular, a first marking (not shown) of the first carrier tape 3 may be located on a lower surface of the second marking recognition unit E2.

When the location of the first carrier tape 3 is aligned as above, the second marking recognition unit E2 may recognize the first marking and transfer the recognized first marking to the control unit. Here, the control unit may transmit the first marking to the controller 600*b*.

Upon receiving the first marking, the controller 600*b* may determine whether the first marking is the same as predetermined mounting information, in operation S122. Here, the predetermined mounting information may include various types of information. For example, the predetermined mounting information may be about a specification, size, and type of the first component 5, a type, production date, and production location of the external electronic device being used, a specification and manufacturer of the carrier tape feeding device F, and an available external electronic device.

Meanwhile, when it is determined that the first marking and the predetermined mounting information are different from each other, the controller 600*b* may stop an operation or activate the alarm unit in operation S124.

When it is determined that the first marking and the predetermined mounting information are the same, the controller 600*b* may store mounting information corresponding to the first marking in operation S123. For example, when the first marking is a QR-code as described above, the controller 600*b* may store mounting information corresponding to the QR-code.

After the mounting information is stored, the controller 600*b* may control the first and second driving power generators 212*a* and 222*a* to operate. Here, the first and second driving power generators 212*a* and 222*a* may respectively rotate the first and second sprockets 211 and 221, in operation S125.

The controller 600*b* may control the third driving unit 230*a* to stop while controlling the first and second driving power generators 212*a* and 222*a* as described above. Here, the rotation unit 230 may freely rotate without stopping with the third driving unit 230*a*.

When the first and second driving power generators 212*a* and 222*a* operate as above, the first carrier tape 3 may be transferred in one direction by the first and second sprockets 211 and 221 inserted into the first transfer hole 3*b*.

Also, the rotation unit 230 may passively rotate by being inserted into the first transfer hole 3*b* while the first carrier tape 3 is being transferred, and thus the transfer of the first carrier tape 3 may not be interfered.

When the first carrier tape 3 is transferred as described above, the first cover tape 2 may be partially detached from the first carrier tape 3 by the cover tape removing unit 700. In particular, as described above, as the first cover tape 2 rotates at one side of the first carrier tape 3, an inside of the first carrier tape 3 may be externally exposed.

When the inside of the first carrier tape 3 is exposed while the first and second driving power generators 212*a* and 222*a* operate, the pick-up nozzle D1 may pick up the first component 5 to externally withdraw the first component 5 from inside the first carrier tape 3 in operation S126. Here, the first and second driving power generators 212*a* and 222*a* may repeatedly operate and stop for a predetermined period of time to sequentially transfer the first carrier tape 3.

In particular, the first and second driving power generators 212*a* and 222*a* may be controlled to stop for a second set period of time after operating for a first set period of time. Alternatively, the first and second driving power generators 212*a* and 222*a* may be alternately repeatedly operate and stop respectively for the first and second set period of times.

Here, a first rotation detecting sensor unit 220*c* and a second rotation detecting sensor unit 320*c* may respectively detect operations of the first and second driving power generators 212*a* and 222*a* and transmit the detected operations to the controller 600*b*. The controller 600*b* may control the first and second driving power generators 212*a* and 222*a* as described above based on signals detected by the first and second rotation detecting sensor units 220*c* and 320*c*.

While the first and second driving power generators 212*a* and 222*a* operate as above, the pick-up nozzle D1 may pick up and withdraw the first component 5 as described above. Here, the pick-up nozzle D1 may pick up the first component 5 when the first and second driving power generators 212*a* and 222*a* stop for the second set period of time.

While the above operation is performed, the first detecting sensor unit 400 may continuously detect the existence of the first carrier tape 3. Here, the first detecting sensor unit 400 may continuously feed the detected result back to the controller 600*b*.

The controller 600*b* may determine whether to continue the operation based on a signal fed back from the first detecting sensor unit in operation S127. In detail, the controller 600*b* may determine the existence of the first carrier tape 3 based on the signal detected by the first detecting sensor unit 400.

Here, when it is determined that the first carrier tape 3 exists, the controller 600*b* may control the first and second driving power generators 212*a* and 222*a* to operate. In other words, as described in operations S125 and S126, the first carrier tape 3 may be transferred while the first component 5 of the first carrier tape 3 is picked up and externally supplied.

In particular, the above operation may be continuously performed as long as the first carrier tape 3 is continuously supplied. In other words, when the first detecting sensor unit 400 detects the first carrier tape 3, the controller 600*b* may continuously control the first and second driving power generators 212*a* and 222*a* as described above.

On the other hand, when the first carrier tape 3 is not detected by the first detecting sensor unit 400, the first detecting sensor unit 400 may transmit a signal related to nonexistence of the first carrier tape 3 to the controller 600*b*.

When such a signal is input, the controller 600*b* may stop the first and second driving power generators 212*a* and 222*a* in operation S128. In other words, the controller 600*b* may stop the first and second driving power generators 212*a* and 222*a* to stop the transfer of the first carrier tape 3.

Meanwhile, when the above operation is completed, the controller 600*b* may again drive the first and second driving power generators 212*a* and 222*a* at a predetermined speed. In detail, by driving the first and second driving power generators 212*a* and 222*a* at the predetermined speed, the first component 5 in a remaining region of the first carrier tape 3 may be supplied to the chip mounting apparatus D, in operation S129.

Here, the controller 600*b* may control the first and second driving power generators 212*a* and 222*a* to transfer the first carrier tape 3 by a predetermined amount. In detail, the controller 600*b* may control the first and second driving power generators 212*a* and 222*a* to repeatedly operate and stop for a predetermined set period of time.

In particular, the controller 600*b* may control the first and second driving power generators 212*a* and 222*a* to operate for a third set period of time and stop for a fourth set period of time. Alternatively, the controller 600*b* may control the first and second driving power generators 212*a* and 222*a* to alternately operate and stop. Here, as described above, the controller 600*b* may control the first and second driving power generators 212*a* and 222*a* based on results measured by the first and second rotation detecting sensor units 220*c* and 320*c*.

2. Replace with Second Carrier Tape after First Carrier Tape is Vanished

Meanwhile, the first carrier tape 3 may be fully vanished when the controller 600*b* controls the first and second driving power generators 212*a* and 222*a* as described above. At this time, when the first carrier tape 3 is fully vanished, the carrier tape loading unit 100 operates to supply the second carrier tape 1 to the rotation unit 230. Since a method of supplying the second carrier tape 1 is described above in detail, details thereof are not repeated here.

When the second carrier tape 1 is supplied to the rotation unit 230, the controller 600*b* may determine whether a signal is detected by the second detecting sensor unit 500 in operation S131. In particular, the second detecting sensor unit 500 may detect the existence of the second carrier tape 1 as described above. Also, the controller 600*b* may determine the existence of the second carrier tape 1 based on a signal transmitted from the second detecting sensor unit 500.

Here, when it is determined that the second carrier tape 1 does not exist based on the signal transmitted from the second detecting sensor unit 500, the controller 600*b* may control the alarm unit to warn the user about no operation or externally transmit an alarm, in operation S141. Also, the controller 600*b* may stop an operation of the carrier tape feeding device F by controlling the first driving power generator 212*a* or the second driving power generator 222*a* to stop.

On the other hand, when it is determined that the second carrier tape 1 exists based on the signal transmitted from the second detecting sensor unit 500, the controller 600*b* may control the third driving unit 230*a* to operate at the first speed in operation S132. In particular, the controller 600*b* may control the third driving unit 230*a* to operate at the first speed so as to transfer the second carrier tape 1.

While the third driving unit 230*a* is controlled as above, the signal detected by the first detecting sensor unit 400 may be transmitted to the controller 600*b*. Here, the controller 600*b* may determine the existence of the second carrier tape 1 on the first detecting sensor unit 400 based on the signal detected by the first detecting sensor unit 400 in operation S133.

In detail, when it is determined that the second carrier tape 1 does not exist on the first detecting sensor unit 400 based on the signal of the first detecting sensor unit 400, the controller 600*b* may control the third driving unit 230*a* to continuously operate at the first speed.

On the other hand, when it is determined that the second carrier tape 1 exists on the first detecting sensor unit 400 based on the signal of the first detecting sensor unit 400, the controller 600*b* may control the third driving unit 230*a* to stop in operation S134. Here, the second carrier tape 1 may be continuously transferred and one end of the second carrier tape 1 may be located on the first detecting sensor unit 400.

After the above operation is completed, the controller 600*b* may control the third driving unit 230*a* to operate at the second speed in operation S135. In particular, the controller 600*b* may control a rotation time or a rotation number of the third driving unit 230*a* to transfer the second carrier tape 1 by a predetermined distance. Here, as described above, the controller 600*b* may control the third driving unit 230*a* to rotate at the second speed for the first period of time so as to transfer the second carrier tape 1 by the predetermined distance in operation S136.

Meanwhile, when the third driving unit 230*a* is controlled as above, the second carrier tape 1 may be transferred towards the first and second sprockets 211 and 221. In particular, a second transfer hole (not shown) of the second carrier tape 1 may be engaged to the first and second sprockets 211 and 221. Here, the first and second sprockets 211 and 221 may passively rotate according to the transfer of the second carrier tape 1.

The controller 600*b* may control the third driving unit 230*a* to stop such that the second carrier tape 1 is transferred by the predetermined distance in operation S137. Here, when the third driving unit 230*a* is stopped, one end of the second carrier tape 1 may be located at the second sprocket 221. In other words, the one end of the second carrier tape 1 may be disposed below the pick-up nozzle D1.

When such an operation is completed, the second marking recognition unit E2 may recognize a second marking (not shown) of the second carrier tape 1. In detail, as described above, the second marking recognition unit E2 may recognize the second marking and transmit the second marking to the control unit.

The control unit transmits the second marking again to the controller 600*b*, and the controller 600*b* may determine whether the second marking matches predetermined mounting information in operation S138. Here, since the predetermined mounting information is the same or similar to that described above, details thereof are not repeated here.

When it is determined that the second marking and the predetermined mounting information do not match, the controller 600*b* may control the alarm unit to notify or transmit an alarm about no operation in operation S141. In this case, the controller 600*b* may stop an operation of the carrier tape feeding device F.

On the other hand, when the second marking and the predetermined mounting information match, the controller 600*b* may store mounting information corresponding to the second marking in operation S139. Here, since the mounting information stored in the controller 600*b* is the same or similar to that described above, details thereof are not repeated here.

After the mounting information is stored, the controller 600*b* may control the first and second driving power generators 212*a* and 222*a* to operate. In detail, the controller 600*b* may control the first and second driving power generators 212*a* and 222*a* to repeatedly operate and stop.

In particular, the controller 600*b* may control the first and second driving power generators 212*a* and 222*a* to stop for the second set period of time after driving the first and second driving power generators 212*a* and 222*a* for the first set period of time. Here, the pick-up nozzle D1 may pick up and externally withdraw a second component (not shown) of the second carrier tape 1 for the second set period of time, in operation S143.

While such an operation is performed, the first detecting sensor unit 400 may continuously detect the existence of the second carrier tape 1. Here, the first detecting sensor unit 400 may transmit a detected signal to the controller 600*b*. The controller 600*b* may determine the existence of the second carrier tape 1 based on the signal detected by the first detecting sensor unit 400, in operation S144.

When it is determined that the second carrier tape 1 exists based on the signal detected by the first detecting sensor unit 400, the controller 600*b* may continuously control the first and second driving power generators 212*a* and 222*a* to operate as above, in operation S142.

On the other hand, when it is determined that the second carrier tape 1 does not exist based on the signal detected by the first detecting sensor unit 400, the controller 600*b* may drive the first and second driving power generators 212*a* and 222*a* at a predetermined speed.

In detail, the controller 600*b* may drive the first and second driving power generators 212*a* and 222*a* at the predetermined speed so as to transfer the second component in a remaining region of the second carrier tape 1 to the chip mounting apparatus D, in operation S145.

Here, the controller 600b may control the first and second driving power generators 212a and 222a to transfer the second carrier tape 1 by a predetermined amount. In detail, the controller 600b may control the first and second driving power generators 212a and 222a to repeatedly operate and stop for predetermines set period of times.

In particular, the controller 600b may control the first and second driving power generators 212a and 222a to operate for a third set period of time and stop for a fourth set period of time. Alternatively, the controller 600b may control the first and second driving power generators 212a and 222a to alternately operate and stop. When the first and second driving power generators 212a and 222a operate as above, the second component at the end of the second carrier tape 1 may be completely externally withdrawn.

Accordingly, according to embodiments of the present invention, carrier tapes may be sequentially supplied such that operations are quickly and smoothly performed without having to replace a carrier tape. In addition, since a plurality of carrier tapes can be automatically supplied through a simple structure instead of a skilled worker manually replacing them, flaws and malfunctions in products caused by a non-skilled worker can be reduced.

According to embodiments of the present invention, collection apparatuses of carrier tapes and cover tapes may not be differently designed according to changes of widths of the carrier tapes and cover tapes, and even when the widths of the carrier tapes and cover tapes are wide, a width increase of a carrier tape feeding device may be reduced.

Also, according to embodiments of the present invention, a loss of carrier tapes may be prevented and continuity of operations may be obtained by accurately and sequentially supplying carrier tapes by using a pick-up nozzle after replacing carrier tapes in a carrier tape feeding device.

While this invention has been particularly shown and described with reference to preferred embodiments thereof, various changes or modifications in form and details may be made therein without departing from the spirit and scope of the invention. Therefore, the appended claims will involve the changes or modifications as long as the changes or modifications belong to the spirit of the invention.

INDUSTRIAL APPLICABILITY

According to an embodiment of the present invention, a carrier tape feeding device for a chip mounter is provided, and the carrier tape feeding device may be mounted on a chip mounting apparatus to supply semiconductor parts. The embodiments of the present invention may be applied to surface-mount semiconductor parts on devices, such as PCBs, electronic devices, and the like, using the semiconductor parts.

The invention claimed is:

1. A carrier tape feeding device comprising:
a transfer unit for transferring a first carrier tape and a second carrier tape sequentially to a chip mounting apparatus;
a rotation unit selectively engaged to a part of the first carrier tape with which a part of the second carrier tape contacts, and for transferring the second carrier tape to the transfer unit;
a detecting sensor unit for detecting sequential existence of the first carrier tape or the second carrier tape supplied to the transfer unit, and existence of the second carrier tape supplied to the rotation unit; and
a controller for determining existence of the first carrier tape based on a signal detected by the detecting sensor unit, and controlling at least one of the transfer unit and the rotation unit to be driven based on the existence of the first carrier tape,
wherein the transfer unit comprises a first transfer unit for transferring the first carrier tape of the second carrier tape and a second transfer unit spaced apart from the first transfer unit in a predetermined interval to transfer the first carrier tape or the second carrier tape,
wherein the second transfer unit comprises a second sprocket for transferring the first carrier tape or the second carrier tape as a part of the second sprocket is inserted into a first transfer hole of the first carrier tape or a second transfer hole of the second carrier tape, and
wherein the chip mounting apparatus comprises a pick-up nozzle for picking up a first component of the first carrier tape or a second component of the second carrier tape, wherein the pick-up nozzle is disposed over a center of rotation of the second sprocket.

2. The carrier tape feeding device of claim 1, wherein the detecting sensor unit comprises a first detecting sensor unit disposed between the transfer unit and the rotation unit to detect existence of the first carrier tape or the second carrier tape sequentially supplied by the rotation unit.

3. The carrier tape feeding device of claim 1, wherein the detecting sensor unit comprises a second detecting sensor unit spaced apart from the rotation unit in a predetermined interval, and for detecting existence of at least one of the first carrier tape and the second carrier tape supplied to the rotation unit.

4. The carrier tape feeding device of claim 1, wherein the transfer unit comprises a first sprocket for determining a location of the first carrier tape or the second carrier tape as a part of the first sprocket is inserted into the first transfer hole of the first carrier tape or the second transfer hole of the second carrier tape.

5. The carrier tape feeding device of claim 1, further comprising:
a base frame for forming an external appearance, wherein the detecting sensor unit, the transfer unit, the rotation unit, and the controller are provided in the base frame; and
a connection detecting sensor unit for detecting a connection between the chip mounting apparatus and the base frame, wherein the connection detecting sensor unit is provided in the base frame.

6. The carrier tape feeding device of claim 1, wherein, when nonexistence of the first carrier tape is determined based on a signal detected by the detecting sensor unit, the controller controls the rotation unit to transfer the second carrier tape from the rotation unit to the transfer unit.

7. The carrier tape feeding device of claim 1, wherein, when existence of the first carrier tape is detected by the detecting sensor unit, the controller drives the transfer unit to supply the first carrier tape to the chip mounting apparatus.

8. The carrier tape feeding device of claim 1, wherein, when it is determined that supply of the first carrier tape is completed based on a signal detected by the detecting sensor unit, the controller drives the transfer unit for a first period of time so as to supply the first carrier tape to the chip mounting apparatus.

9. The carrier tape feeding device of claim 1, further comprising an alarm unit for providing information to an external user via sound or an image.

10. The carrier tape feeding device of claim 9, wherein, when nonexistence of the second carrier tape is detected by the detecting sensor unit, the controller controls the alarm unit to provide information about the nonexistence of the second carrier tape to the external user.

11. The carrier tape feeding device of claim 1, further comprising: a handle unit spaced apart from an outer circumferential surface of the rotation unit for selectively engaging the second carrier tape which contacts an outer surface of the first carrier tape;
   a block unit rotatably connected to the handle unit and configured to exert a force on the second carrier tape toward the rotation unit; and
   a movement prevention part protruding from the handle unit toward the rotation unit and selectively preventing the second carrier tape from being transferred by the transfer unit,
   wherein the first carrier tape is interposed between the second carrier tape and the rotation unit.

12. A carrier tape feeding device comprising:
   a transfer unit for transferring a first carrier tape and a second carrier tape sequentially to a chip mounting apparatus;
   wherein the transfer unit comprises a first transfer unit for transferring the first carrier tape of the second carrier tape and a second transfer unit spaced apart from the first transfer unit in a predetermined interval to transfer the first carrier tape or the second carrier tape,
   a carrier tape loading unit for supplying the first carrier tape and the second carrier tape to the transfer unit, wherein, the carrier tape loading unit comprises:
   a rotation unit selectively engaged to a part of the first carrier tape with which a part of the second carrier tape contacts, and for transferring the second carrier tape to the transfer unit, wherein the first carrier tape is interposed between the second carrier tape and the rotation unit;
   a handle unit spaced apart from an outer circumferential surface of the rotation unit for selectively engaging the second carrier tape which contacts an outer surface of the first carrier tape;
   a block unit rotatably connected to the handle unit;
   a first elastic unit disposed between the block unit and the handle unit to push the block unit towards the rotation unit; and
   a movement prevention part protruding from the handle unit toward the rotation unit and selectively preventing the second carrier tape from being transferred by the transfer unit;
   a detecting sensor unit for detecting sequential existence of the first carrier tape or the second carrier tape supplied to the transfer unit, and existence of the second carrier tape supplied to the rotation unit; and a controller for determining existence of the first carrier tape based on a signal detected by the detecting sensor unit, and controlling at least one of the transfer unit and the rotation unit to be driven based on the existence of the first carrier tape.

13. The carrier tape feeding device of claim 12, wherein the detecting sensor unit comprises a first detecting sensor unit disposed between the transfer unit and the rotation unit to detect existence of the first carrier tape or the second carrier tape sequentially supplied by the rotation unit.

14. The carrier tape feeding device of claim 12, wherein the detecting sensor unit comprises a second detecting sensor unit spaced apart from the rotation unit in a predetermined interval, and for detecting existence of at least one of the first carrier tape and the second carrier tape supplied to the rotation unit.

15. The carrier tape feeding device of claim 12, wherein the transfer unit comprises a first sprocket for determining a location of the first carrier tape or the second carrier tape as a part of the first sprocket is inserted into a first transfer hole of the first carrier tape or a second transfer hole of the second carrier tape.

16. The carrier tape feeding device of claim 12, wherein the transfer unit comprises a second sprocket for transferring the first carrier tape or the second carrier tape as a part of the second sprocket is inserted into a first transfer hole of the first carrier tape or a second transfer hole of the second carrier tape.

17. The carrier tape feeding device of claim 16, wherein the chip mounting apparatus comprises a pickup nozzle for picking up a first component of the first carrier tape or a second component of the second carrier tape, wherein the pick-up nozzle is disposed over a center of rotation of the second sprocket.

18. The carrier tape feeding device of claim 12, further comprising:
   a base frame for forming an external appearance, wherein the detecting sensor unit, the transfer unit, the rotation unit, and the controller are provided in the base frame; and
   a connection detecting sensor unit for detecting a connection between the chip mounting apparatus and the base frame, wherein the connection detecting sensor unit is provided in the base frame.

19. The carrier tape feeding device of claim 12, wherein, when nonexistence of the first carrier tape is determined based on a signal detected by the detecting sensor unit, the controller controls the rotation unit to transfer the second carrier tape from the rotation unit to the transfer unit.

20. The carrier tape feeding device of claim 12, wherein, when existence of the first carrier tape is detected by the detecting sensor unit, the controller drives the transfer unit to supply the first carrier tape to the chip mounting apparatus.

21. The carrier tape feeding device of claim 12, wherein, when it is determined that supply of the first carrier tape is completed based on a signal detected by the detecting sensor unit, the controller drives the transfer unit for a first period of time so as to supply the first carrier tape to the chip mounting apparatus.

22. The carrier tape feeding device of claim 12, further comprising an alarm unit for providing information to an external user via sound or an image.

23. The carrier tape feeding device of claim 22, wherein, when nonexistence of the second carrier tape is detected by the detecting sensor unit, the controller controls the alarm unit to provide information about the nonexistence of the second carrier tape to the external user.

24. A carrier tape feeding device comprising:
   a transfer unit for transferring a first carrier tape and a second carrier tape sequentially to a chip mounting apparatus;
   a carrier tape loading unit for supplying the first carrier tape and the second carrier tape to the transfer unit, wherein, the carrier tape loading unit comprises:
   a rotation unit selectively engaged to a part of the first carrier tape with which a part of the second carrier tape contacts, and for transferring the second carrier tape to the transfer unit, wherein the first carrier tape is interposed between the second carrier tape and the rotation unit;
   a handle unit spaced apart from an outer circumferential surface of the rotation unit for selectively engaging the second carrier tape which contacts an outer surface of the first carrier tape;
a block unit rotatably connected to the handle unit and exerting a force toward the rotation unit;
a deviation prevention member interposed between the handle unit and the block unit and maintaining a predetermined rotation angle difference between the handle unit and the block unit; and
a movement prevention part protruding from the handle unit toward the rotation unit and selectively preventing the second carrier tape from being transferred by the transfer unit;
a detecting sensor unit for detecting sequential existence of the first carrier tape or the second carrier tape supplied to the transfer unit, and existence of the second carrier tape supplied to the rotation unit; and
a controller for determining existence of the first carrier tape based on a signal detected by the detecting sensor unit, and controlling at least one of the transfer unit and the rotation unit to be driven based on the existence of the first carrier tape.

25. The carrier tape feeding device of claim 24, wherein the transfer unit comprises:
a first transfer unit for transferring the first carrier tape or the second carrier tape; and
a second transfer unit spaced apart from the first transfer unit in a predetermined interval to transfer the first carrier tape or the second carrier tape.

26. The carrier tape feeding device of claim 24, wherein the detecting sensor unit comprises:
a first detecting sensor unit disposed between the transfer unit and the rotation unit to detect existence of the first carrier tape or the second carrier tape sequentially supplied by the rotation unit; and
a second detecting sensor unit spaced apart from the rotation unit in a predetermined interval, and for detecting existence of at least one of the first carrier tape and the second carrier tape supplied to the rotation unit.

27. The carrier tape feeding device of claim 24, wherein the transfer unit comprises a first sprocket for determining a location of the first carrier tape or the second carrier tape as a part of the first sprocket is inserted into a first transfer hole of the first carrier tape or a second transfer hole of the second carrier tape.

28. The carrier tape feeding device of claim 24, wherein the transfer unit comprises a second sprocket for transferring the first carrier tape or the second carrier tape as a part of the second sprocket is inserted into a first transfer hole of the first carrier tape or a second transfer hole of the second carrier tape.

29. The carrier tape feeding device of claim 24, further comprising:
a base frame for forming an external appearance, wherein the detecting sensor unit, the transfer unit, the rotation unit, and the controller are provided in the base frame; and
a connection detecting sensor unit for detecting a connection between the chip mounting apparatus and the base frame, wherein the connection detecting sensor unit is provided in the base frame.

30. The carrier tape feeding device of claim 24, wherein, when nonexistence of the first carrier tape is determined based on a signal detected by the detecting sensor unit, the controller controls the rotation unit to transfer the second carrier tape from the rotation unit to the transfer unit.

31. The carrier tape feeding device of claim 24, wherein, when existence of the first carrier tape is detected by the detecting sensor unit, the controller drives the transfer unit to supply the first carrier tape to the chip mounting apparatus.

* * * * *